(12) United States Patent
Sundstrom et al.

(10) Patent No.: US 8,748,750 B2
(45) Date of Patent: Jun. 10, 2014

(54) PRINTED BOARD ASSEMBLY INTERFACE STRUCTURES

(75) Inventors: Lance L. Sundstrom, Pinellas Park, FL (US); Michael J. Gillespie, Seminole, FL (US); Rainer Blomberg, Palm Harbor, FL (US)

(73) Assignee: Honeywell International Inc., Morristown, NJ (US)

( * ) Notice: Subject to any disclaimer, the term of this patent is extended or adjusted under 35 U.S.C. 154(b) by 125 days.

(21) Appl. No.: 13/179,091

(22) Filed: Jul. 8, 2011

(65) Prior Publication Data

US 2013/0010432 A1   Jan. 10, 2013

(51) Int. Cl.
     *H05K 1/16* (2006.01)

(52) U.S. Cl.
     USPC ............... 174/252; 174/260; 361/760

(58) Field of Classification Search
     CPC ......... H05K 1/00; H05K 1/02; H05K 1/0201; H05K 1/0203; H05K 1/0204; H05K 1/0206; H05K 1/0207; H05K 1/0209; H05K 1/18; H05K 1/181; H05K 1/183; H05K 3/301; H05K 3/303; H05K 3/32; H05K 7/2039
     USPC .......... 174/250, 252, 259–262, 521; 257/713, 257/795, 788; 361/712, 709, 539, 782, 760; 438/119
     See application file for complete search history.

(56) References Cited

U.S. PATENT DOCUMENTS

| | | | |
|---|---|---|---|
| 4,847,446 A | 7/1989 | King et al. | |
| 5,055,637 A | 10/1991 | Hagner | |
| 5,659,951 A | 8/1997 | Gall et al. | |
| 6,262,480 B1 | 7/2001 | Ferri et al. | |
| 6,501,160 B1 | 12/2002 | Higuchi et al. | |
| 7,199,466 B2 | 4/2007 | Chiu | |
| 7,215,013 B2 | 5/2007 | Nozu | |
| 7,496,271 B2 | 2/2009 | Quaderer | |
| 7,719,110 B2 | 5/2010 | Zhao et al. | |
| 7,803,664 B2 | 9/2010 | Colgan et al. | |
| 8,228,682 B1 * | 7/2012 | Zohni et al. | 361/782 |

(Continued)

FOREIGN PATENT DOCUMENTS

| | | |
|---|---|---|
| EP | 2 216 814 A2 | 8/2010 |
| WO | 00/14771 A2 | 3/2000 |

OTHER PUBLICATIONS

Analog Devices, "Dual, Low-Offset, Low Noise Operational Amplifier", OP227, Feb. 26, 2008, 5 pages.

(Continued)

*Primary Examiner* — Hoa C Nguyen
*Assistant Examiner* — Amol Patel
(74) *Attorney, Agent, or Firm* — Shumaker & Sieffert, P.A.

(57) ABSTRACT

Example printed board assembly (PBA) interfaces are described. In some examples, the disclosure relates to a printed board (PB) including a conductive layer, where the PB defines a first surface and a recess in the first surface, where a surface defining the recess is at least one of electrically or thermally connected to the conductive layer, and an electrical component body mounted on the PB. The electrical component body may be mounted on the PB such that a surface of the electrical component body extends over at least a portion of the recess, where the recess extends beyond the electrical component body such that the recess defines an aperture for introducing an interface material between the surface of the electrical component body and the surface of the recess.

23 Claims, 11 Drawing Sheets

(56) References Cited

U.S. PATENT DOCUMENTS

| | | |
|---|---|---|
| 8,263,878 B2 * | 9/2012 | Takenaka et al. ............. 174/262 |
| 2003/0059151 A1 | 3/2003 | Brist et al. |
| 2004/0037059 A1 | 2/2004 | Stiborek et al. |
| 2004/0055152 A1 * | 3/2004 | Fraivillig ...................... 29/830 |
| 2004/0193989 A1 | 9/2004 | Welbon et al. |
| 2005/0286234 A1 | 12/2005 | Campbell et al. |
| 2007/0278001 A1 | 12/2007 | Mayder et al. |
| 2009/0008128 A1 * | 1/2009 | Hasebe et al. ................. 174/252 |
| 2009/0152714 A1 | 6/2009 | Yamagishi et al. |
| 2012/0146177 A1 * | 6/2012 | Choi et al. .................... 257/528 |

OTHER PUBLICATIONS

Assembly Instructions for CQFP Packages SMT on PCB, Actel Corporation, Jun. 2003, 4 pages.

* cited by examiner

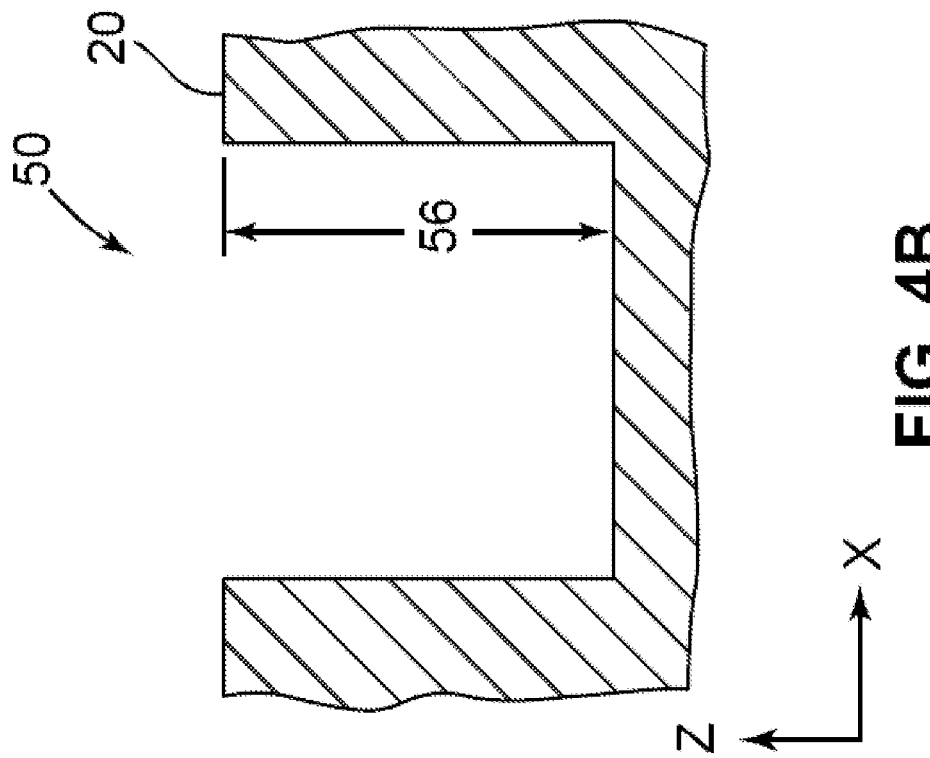
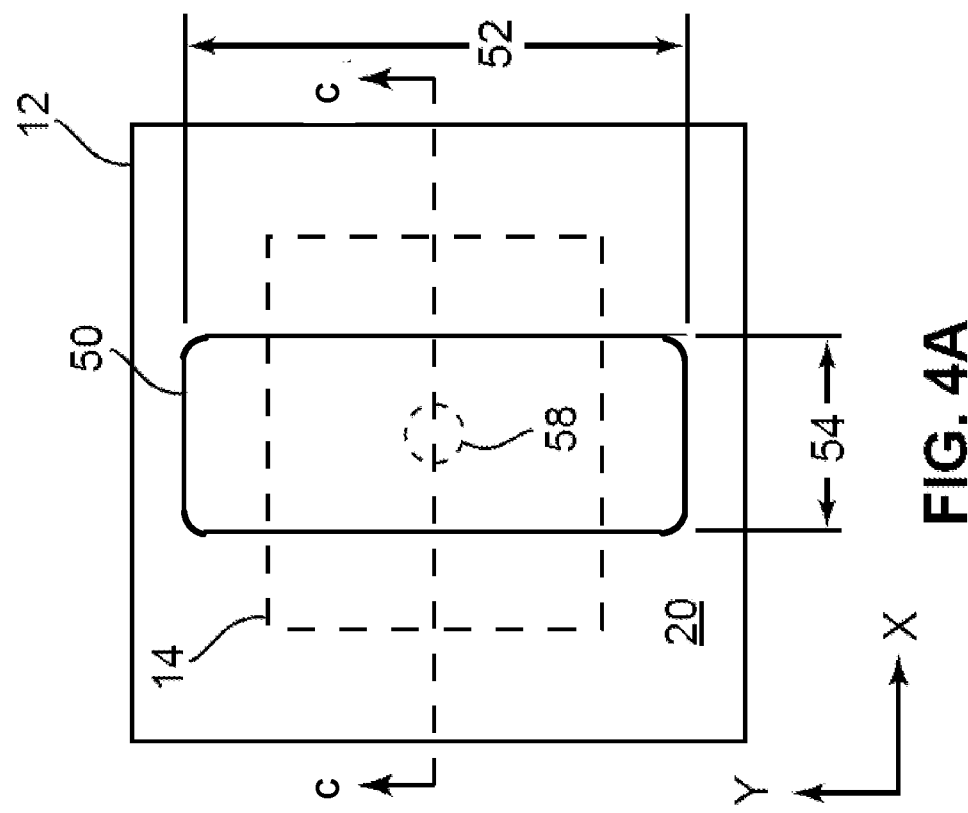
FIG. 4B
FIG. 4A

PRINTED BOARD ASSEMBLY INTERFACE STRUCTURES

TECHNICAL FIELD

This disclosure relates to printed board assembly (PBA) devices and, more particularly, to PBA interfaces features and methods.

BACKGROUND

An electrical component, such as a discrete device or a packaged integrated circuit (IC) or a non-electrical component, such as a heat sink, can be mounted on a printed board (PB). The PB in turn can provide mechanical support for the component, allowing the component to be physically incorporated into the PBA device. The PBA in turn can be mechanically supported by a PB mounting interface, which might be one or more wedge clamps, thermal bridges and/or support frames. If the thermal bridges and/or support frames include outer covers, such components can also serve as electromagnetic interference/compatibility (EMI/EMC) covers. The PB can also provide electrical and/or thermal connectivity, allowing the component and/or PB mounting interface to be electrically and/or thermally integrated into a PBA device. PB conductor layers may primarily be formed of copper (Cu), which is both electrically and thermally conductive.

SUMMARY

In general, the disclosure is directed to a component assembly which may include a component and a PB including at least one recess into a surface of the PB. In some examples, the component may be mounted on the PB over a portion of the recess such that an aperture is formed between the component and the recess. The aperture may allow for an interface material to be injected or otherwise introduced into the interfacial gap between the component and recess in the PB. In some examples, the interface material provided in the interfacial gap may include a thermal interface material that defines a thermal pathway between the component and one or more thermally conductive layers of the PB.

In one example, the disclosure relates to an assembly comprising a PB including a conductive layer, wherein the PB defines a first surface and a recess in the first surface, wherein a surface defining the recess is at least one of electrically or thermally connected to the conductive layer. The assembly also comprises an electrical component body mounted on the PB such that a surface of the electrical component body extends over at least a portion of the recess, wherein the recess extends beyond the electrical component body such that the recess defines an aperture for introducing an interface material between the surface the electrical component body and the surface of the recess.

In another example, the disclosure relates to a method comprising placing an electrical component body over a surface of a PB that includes a conductive layer, wherein the PB defines a first surface and a recess in the first surface, wherein a surface defining the recess is at least one of electrically or thermally connected to the conductive layer; and mounting the electrical component body on the PB such that a surface of the electrical component body extends over at least a portion of the recess, wherein the recess extends beyond the electrical component body such that the recess defines an aperture for introducing an interface material between the surface of the electrical component body and the surface of the recess.

In another example, the disclosure relates to an assembly comprising a PB including a thermally conductive layer, wherein the PB defines a first surface and a recess in the first surface, and wherein a surface defining the recess is thermally connected to the thermally conductive layer; an electrical component body mounted on the PB such that a surface of the electrical component body bridges across the recess; and a thermal interface material in the recess, the thermal interface material defining a thermal pathway between the surface of the electrical component and the surface of the recess, wherein the recess extends beyond the electrical component body such that the recess defines an aperture for introducing the thermal interface material between the surface of the electrical component body and the surface of the recess.

The details of one or more examples are set forth in the accompanying drawings and the description below. Other features, objects, and advantages will be apparent from the description and drawings, and from the claims.

BRIEF DESCRIPTION OF DRAWINGS

FIGS. 4A and 4B are conceptual diagrams illustrating top and side views of one example recess that may be used in the example electrical component assembly 10 of FIG. 1.

DETAILED DESCRIPTION

Figure 1:
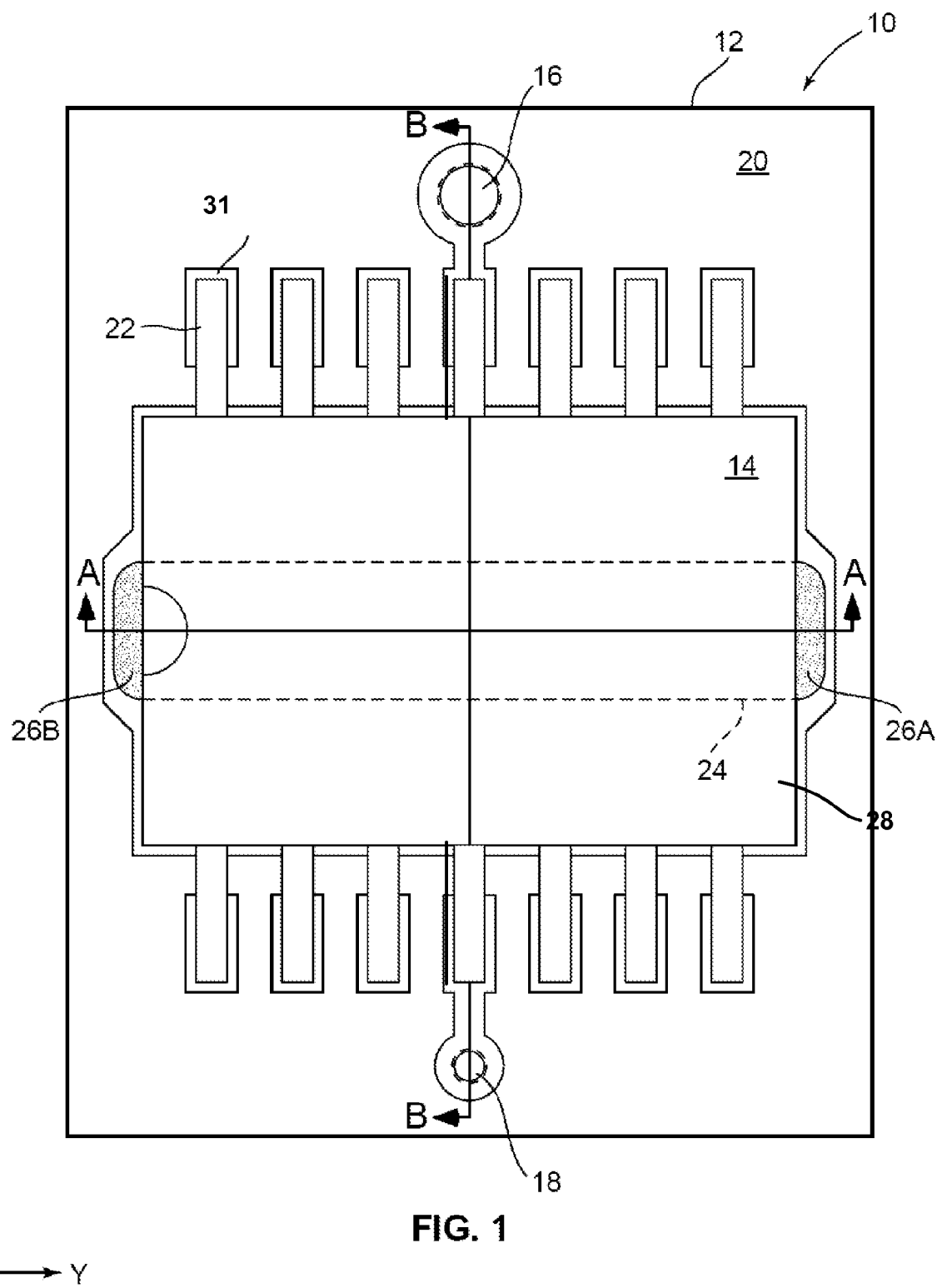
FIG. 1 is a conceptual diagram illustrating an example electrical component assembly 10 from a top view.

Electrical and non-electrical components can be incorporated into a variety of different component assembly devices.

In some examples, a printed board assembly (PBA) device includes one or more electrical and/or non-electrical components mechanically, electrically and/or thermally bonded to a printed board (PB). The PB provides mechanical support and electrical and/or thermal connectivity for the one or more electrical and/or non-electrical components. The one or more electrical components may be one or more discrete electrical components, one or more integrated circuit (IC) components, or a combination of one or more discrete electrical components and one or more IC components. Discrete electrical components are individual circuit elements, such as transistors, diodes, resistors, capacitors, inductors, and the like. IC components, by contrast, contain two or more circuit elements in single circuit package. The one or more non-electrical components include heat sinks, electromagnetic interference/compatibility (EMI/EMC) covers, wedge clamps, stiffener frames, thermal bridges and the PBA mounting interface. More complex circuits can be formed by electrically connecting multiple discrete electrical components, multiple IC components and multiple non-electrical components, or a combination of discrete electrical components, IC components and non-electrical components.

In some examples, multiple components can be mounted on and electrically, thermally and/or mechanically connected to a PB to create a network of interconnected components. The interconnected components and PB mounting interface can provide one or more paths for electrical and/or thermal current to flow, thereby defining one or more electrical and/or thermal circuits. During operation, electrons may flow through an electrical component mounted on the PB, which may generate heat as electrical energy is converted into thermal energy. This generated heat raises the temperature of the one or more IC die, or other component(s), within the electrical component package. If the thermal impedance between the IC die and its host PB is not sufficiently low, the IC die temperature can exceed its safe operating temperature.

Enhanced thermal conduction across the component to PB interface may be required to remove enough of this heat to keep the IC die within its safe operating temperature range. Also, multiple IC die outputs switching simultaneously in the same direction can cause high currents in the power and ground paths between the IC die and its host PB. If the electrical impedance of the power and ground paths between the IC die and its host PB are not sufficiently low, the power and ground currents from simultaneously switching outputs (SSO) can cause transient voltages across these power and ground paths, referred to as rail bounce. This rail bounce can degrade signal integrity (SI) to the point where input or output errors occur. Enhanced electrical conduction across the component to PB interface may be required to limit IC die rail bounce to tolerable levels.

Also, the radiated emissions from a PBA or the susceptibility of a PBA to its own or other radiated emissions can cause one or more functional failures or a failure of one or more EMI/EMC requirements. Enhanced electrical conduction at EMI/EMC cover footprints and shielding at PB edges may be required to meet EMI/EMC requirements. In some cases, only enhanced mechanical bonding is required at the component to PB interface to insure reliable mechanical support of the component in the target temperature, acceleration, shock and vibration environments.

A high-power surface mount technology (SMT) electrical component may require an interfacial electrically/thermally conductive material between its package body bottom and a PB attach pad for proper conducted thermal management and to prevent floating metal (e.g. to terminate an electrically isolated package case or metalized bottom). Because these interface materials are often not compatible with vapor phase solder reflow temperature profiles, for example, the interface materials must be added after the component solder attach process so that they can be cured at a lower temperature. However, when a resin, such as an epoxy, is loaded with enough filler to become significantly electrically/thermally conductive, it becomes too viscous to flow into an interfacial gap between the surface of the component body and its PB attach pad by capillary action (i.e. by surface whetting). Because of the higher viscosity, an electrically/thermally conductive material must be forcibly injected into the interfacial gap. This material is typically injected through an un-plated PB through-hole, commonly referred to as a "squirt hole," from the opposite side of the PBA. This provides the necessary hydraulic pressure to push this thick material into the interfacial gap between the component package body and its PB attach pad.

However, in some examples, such squirt holes may severely limit SMT electrical component placement on double-sided PBA designs (e.g., those with components mounted on opposites PB surfaces). For example, each SMT electrical component with a squirt hole limits component placement on the opposite side of that PB.

As described above, during operation of a component assembly, the one or more electrical components mounted on the PB may generate thermal energy. Specifically, power dissipation associated with an electrical current moving through the one or more electrical components may cause the one or more electrical components to increase in temperature. Effectively dissipating the thermal energy generated by the one or more electrical components (e.g., by conducting it away from the electrical component) may improve the performance of the one or more electrical components by, for example, lowering the thermal impedance between the electrical components and the PB and increasing the reliability of the electrical components relative to an assembly in which heat is not effectively removed or dissipated.

In some cases, during the operation of an IC component, simultaneously switching outputs (SSO) can generate high transient currents in the power and ground paths between the IC die inside the IC component and its host PB which result in transient voltage differences, referred to as rail bounce, between the IC die and its host PB power and ground rails. If the electrical impedance of the power and ground paths between the IC die and its host PB are not sufficiently low, transient SSO currents can cause rail bounce large enough to affect signal integrity (SI) and cause input and/or output errors. Lowering the electrical impedance of the power and ground paths between the IC die and its host PB can improve signal and data integrity and system performance and reliability.

In general, an electrical component includes several different surfaces that may provide electrical and/or thermal conduction pathways for conducting electrical/thermal current to/from the component. With PB mounted components, for example, an electrical component may define a bottom surface adjacent to a printed board surface. In some examples, thermal energy may be removed through the bottom surface of the electrical component and transferred into one or more thermally conductive layers of the PB. Effectively cooling or reducing the operating temperature of the electrical component may, e.g., increase the density with which electrical components can be attached to a PB and/or improve the performance and reliability of an electrical component by reducing its operating temperature.

In accordance with the present disclosure, assemblies including one or more features for improving electrical and/ or thermal conduction and/or mechanical bonding between a component and its host PB are described. In some examples, a component assembly may include a PB that includes an electrically/thermally conductive layer that is electrically/thermally connected to a component mounted on a first surface conductor of the PB. For example, the PB may include a recess into a surface of the PB, and a component extending at least partially over the recess. The recess may be electrically/thermally connected to one or more electrically/thermally conductive PB layers. The assembly may include an interface material in the interfacial interface between the component body and its component footprint, and the component may be mounted on the PB such that an interfacial surface of the component extends over at least a portion of the at least one plated recess.

To introduce an interface material between the component and the PB, the component may be mounted on the PB to cover a portion but not all of the recess. In such a configuration, the component and recess may define one or more apertures (e.g., that provide access to the recess cavity through a surface of the PB to which the component is mounted) for introducing an interface material into the recess. In this manner, the PB may not require an injection hole that extends through an opposite side of the PB from the component. Instead, an interface material may be injected or otherwise introduced via the aperture defined between the PB and the component from the same side of the PB that the component is mounted on, e.g., by injecting an interface material into a portion of the recess not covered by the component. With such an example configuration, the portion of the PB that would otherwise be blocked by an injection hole that extends through an opposite side of the PB may instead be used, e.g., for component placement and/or conductor routing. This may reduce the size of the PB and/or improve conductor routing efficiency and density through the PB as compared to a PB that includes an injection hole extending through the PB. In some examples, a PB may include a first surface with a first recess, and a second surface opposite that of the first surface with a second recess. First and second components may be mounted partially extending over the first and second recesses, respectively, to define apertures for introduction of interface material into each recess.

The interface material may provide electrical, thermal and/or mechanical coupling between the component and the PB and electrical/thermal coupling between an interfacial surface (e.g., a bottom surface) of the component and the electrically/thermally conductive layer of the PB. The interface material may improve mechanical bonding between the component and its host PB and may improve electrical and/or thermal conduction between the component and the one or more conductive layers of the PB, for example, as compared to a component that is mounted to a PB without a plated recess connection and interface material bonding and conduction paths. In the case of a component that is mounted to a PB without interface material, small gaps or "voids" may be present in the interface between the component and the PB that inhibit electrical/thermal conduction between the component and the PB.

In some examples, the recess in the PB is configured such that the component can be mounted to the surface of the PB while still extending over at least a portion of the recess. For example, the recess may be positioned such that the component can be mounted to the PB while straddling, bridging or otherwise extending over a portion of the recess. An interface material may be introduced into the recess via one or more apertures defined by the component and recess, and the recess may provide a pathway or cavity that allows the introduced interface material to flow under the surface of the component after is the component has been mounted to the PB. For example, an interface material may be introduced at one end of the recess until the interface material flows out another end of the recess and/or out the sides the component. In this manner, the recess may be used to interpose an interface material between the component and the PB after the electrical component is mounted to the PB.

In some examples, the recess may be formed with a machining or milling process into the PB and plated to create an electrical/thermal pathway between the component to be mounted to the PB and one or more conductor layers formed on and below the surface of the PB. For example, a PB may include one or more patterned surface and buried conductor layers separated by dielectric layers. The plated recess in the PB may be created by removing a portion of the PB to create a void into the surface of the PB that extends down to the one or more patterned conductor layers or entirely through the PB. For example, the plated recess may be created such that the one or more conductor layers of the PB define a portion of a surface (e.g., a sidewall) of the recess. In any event, the plated recess may provide an electrical/thermal pathway that allows electrical/thermal conduction from the component to the conductor layer(s) of the PB through the interface material and the plated recess. This electrical/thermal pathway may help, for example, cool or reduce the temperature of an electrical component during operation.

In some examples, the interface material may be both electrically and thermally conductive, such as an electrically conductive epoxy or polymer, or it may be electrically non-conductive and thermally conductive, such as a thermal-only conductive epoxy or polymer. An epoxy or polymer that is both electrically and thermally nonconductive typically has no filler material to make it so. Depending upon the component and the application, electrical and thermal conduction, electrical isolation and thermal conduction, or just mechanical bonding may be needed between the component and its host PB. In some examples, the interfacial surface of the component body is not metalized. In such cases, the interface material may be an electrically and/or thermally conductive or an electrically non-conductive and thermally conductive epoxy or polymer that is introduced via one or more injection apertures defined by the recess and component.

In some examples, the at least one recess may define at least one injection flow pathway that may be used to inject the interface material within the recess (e.g., to substantially fill the recess and the interfacial gap between the PB component footprint and the component body). In some examples, the at least one recess may be plated to provide an electrical and/or thermal connection between the component footprint defined in a PB surface conductor layer and at least one other PB conductor layer. Depending on the configuration of the component assembly and the interface material properties, the interface material may improve electrical and/or thermal conduction between the component, and the plated recess connection to at least one other PB conductor layer as compared to a component assembly that does not include an interface material or a PB component with at least one plated recess connection to at least one other PB conductor layer.

Conceptual details for an example method for forming one example electrical component assembly will be described in greater detail with reference to FIGS. 7-11. Example electrical component assemblies including PBs that define a component footprint with a plated recess connection to internal PB conductor layers and an interface material in the plated recess and interfacial gap will first be described with reference to FIGS. 1-6.

FIG. 1 is a conceptual diagram illustrating a top view of an example electrical component assembly 10 according to one aspect of the disclosure. As shown, electrical component assembly 10 includes PB 12 and electrical component body 14. Electrical component body 14 is mounted on surface 20 of PB 12. Electrical component body 14 is shown as part of a 14-pin dual flat pack (DFP) package that includes leads 22 (only one of the fourteen leads is labeled for clarity), which electrically and mechanically connect electrical component body 14 to PB 12. However, other types of components are contemplated. PB 12 includes example through via 16 and example blind via 18, each of which may be used to establish an electrical/thermal connection between surface and other PB conductor layers and to other electrical components mounted to PB 12 (e.g., in examples where electrical component assembly 10 includes multiple electrical component bodies mounted on PB 12). The remaining through-hole and blind via connections to the electrical component body 14 surface footprint are not shown for clarity.

Assembly 10 includes PB 12, and in some cases may be referred to as a PBA, printed wiring assembly (PWA), or a circuit card assembly (CCA). Leads 22 of electrical component body 14 may be mechanically and electrically coupled to PB 12 with a screen printed, stenciled or dispensed solder paste that is vapor phase or hot air reflowed. In different examples, an adhesive, such as an electrically and/or thermally conductive or non-conductive adhesive that is cured, or another mechanical fixation mechanism (e.g., a screw or bolt) can be used to mechanically and/or electrically connect an electrical or non-electrical component to a PB. In one example, an electrical component may be attached to a PB using a through-hole mounting technique where lead pins from the electrical component are inserted into through-holes from a first side of a PB and then wave soldered from an opposite side of the PB. In the present example, electrical component body 14 may be mounted to PB 12 using surface mount technology (SMT) techniques where electrical component body 14 is directly mounted on a component footprint comprised of a pattern of attach pads defined in a surface conductor layer of PB 12. Electrical component body 14 can be attached to PB 12 using any suitable techniques, as will be appreciated by those of skill in the art.

PB 12 may include a variety of different features for electrically, thermally and/or mechanically connecting to electrical component body 14. For example, as shown in FIG. 1, PB 12 may include a component body attach pad 28 and lead attach pads 31 (only one of fourteen lead attach pads is labeled in FIG. 1 for clarity) which mechanically and electrically connect electrical component body 14 and leads 22 to PB 12. Component body attach pad 28 and lead attach pads 31 may be, e.g., solder attach pads or adhesive attach pads. As will be described below, in some examples, component 14 may be attached or otherwise mechanically connected to PB 12 via an interface material introduced into recess 24 via an aperture formed between component 14 and recess 24.

Electrical component body 14 may generally be any integrated circuit (IC) component within a 14-pin dual flat pack (DFP) package. In some examples, as discussed in greater detail below with respect to FIG. 6 assembly 10 can include a plurality of electrical and non-electrical components (e.g., two, three, four or more) mounted on either the same surface 20 or different surfaces (e.g., opposite surfaces) of PB 12. The plurality of electrical and non-electrical components can be separately mounted or mounted together. In some cases, an Analog Devices OP227 dual operational amplifier may need some form of thermal management to stay within its operational temperature. However, other component types that can benefit from the structures and methods of the subject disclosure, and, for example, may include other electrical components in dual flat pack (DFP) packages with other than 14-pins, all quad flat pack (QFP) packages and non-electrical components such as heat sinks, stiffener frames, thermal bridges, wedge clamps, EMI/EMC covers and PB mounting interfaces.

As shown in the example of FIG. 1, PB 12 includes recess 24 formed in component body attach pad 28 in the conductor layer on surface 20 of PB 12. In general, examples of the disclosure are primarily described for cases in which recess 24 is plated. However, other examples in which recess 24 is not plated are contemplated. Plated recess 24 may be in electrical/thermal communication with one or more other PB conductor layers (not shown in FIG. 1) of PB 12, e.g., through a surface that defines a portion of plated recess 24. As will be described in greater detail below, plated recess 24 may be a cavity that extends into the X-Y plane defined by PB surface 20. Electrical component body 14 may be mounted on the PB surface that defines the X-Y plane and extend over at least a portion of plated recess 24 such that plated recess 24 is bounded on three sides by PB 12 and on the forth side by the interfacial surface of electrical component body 14. For example, as illustrated in FIG. 1, electrical component body 14 may bridge over plated recess 24, with electrical component body 14 mechanically and/or electrically/thermally attached to PB 12 via leads 22 and an interfacial material injected between the interfacial surfaces between the electrical component body 14 and its PB surface component footprint with plated recess 24.

Plated recess 24 may be used to inject an interface material (not labeled in FIG. 1) between PB 12 and a surface of electrical component body 14 adjacent to PB 12 (i.e. an interfacial surface). For example, plated recess 24 may be configured to receive an interface material after electrical component body 14 is mounted to PB 12 via leads 22. In this respect, plated recess 24 may define a cavity that is filled at least partially with an interface material. By injecting an interface material between an interfacial surface of electrical component body 14 (e.g., a bottom surface of electrical component body 14 adjacent to PB 12) and PB 12, the interfacial mechanical bond strength and the electrical and/or thermal conduction between the electrical component body 14 and PB 12 may be significantly increased compared to that of electrical component body 14 mounted to PB 12 without plated recess 24 and an interface material.

For example, in some instances, during the fabrication of assembly 10, an interfacial surface of electrical component body 14 may be placed directly adjacent to and in direct contact with surface 20 of PB 12. However, the interfacial surface of electrical component body 14 and/or the area of surface 20 of PB 12 over which electrical component body 14 is placed may not be perfectly flat, resulting in localized separation gaps or "voids" between portions of the interfacial surface of electrical component body 14 and surface 20 of PB 12. These interfacial gaps or voids may limit the amount of interfacial electrical and/or thermal conduction between electrical component body 14 and PB 12 to cool electrical component body 14. For example, air or other gas in the separation gaps or voids between electrical component body 14 and PB 12 may reduce the amount of electrical and/or thermal conduction between electrical component body 14 and PB 12, e.g., as compared to when interfacial surfaces of electrical component body 14 and PB 12 are in direct contact with each other without separation gaps or voids.

As an alternative, an interface material may be positioned between the interfacial surface of electrical component body 14 and PB 12 to fill the separation gaps between electrical component body 14 and PB 12 that may otherwise be filled with air or another gas. The interface material may exhibit a higher electrical and/or thermal conductivity than the air or other gas. In this manner, positioning an interface material between the interfacial surface of electrical component body 14 and PB 12 may increase electrical and/or thermal conduction out of electrical component body 14 compared to that of assemblies including an electrical component that is mounted to a PB without an interface material provided in such a manner.

Referring still to FIG. 1, even with electrical component body 14 mounted on PB 12, recess 24 may be accessible through one or more apertures in PB 12 corresponding to the portions of recess 24 not covered by electrical component body 14. In some examples, such apertures may allow an interface material to be introduced into the cavity formed by recess 24 and the gap between electrical component body 14 and PB 12 after positioning electrical component body 14 over at least a portion of recess 24. For instance, as shown in the example of FIG. 1, a portion of recess 24 may extend beyond electrical component body 14 (in the X-Y plane illustrated in FIG. 1) to define one or more apertures 26A and 26B (collectively "aperture 26") for introducing an interface material into recess 24. Even with electrical component body 14 mounted to PB 12, an interface material may be introduced into recess 24 through aperture 26, and recess 24 may provide a pathway that allows the interface material to travel between PB 12 and electrical component body 14 within the interfacial gap between the two. Depending on the configuration of assembly 10 and the type of interface material used, the interface material may flow between PB 12 and the surface of the body of electrical component body 14 adjacent PB 12, filling at least a portion of recess 24. In some examples, the interface material may also flow between surface 20 of PB 12 and electrical component body 14 in one or more areas adjacent recess 24.

As will be described further below, when assembly 10 is assembled as shown in FIG. 1, electrical and/or thermal conduction between the interfacial surface(s) of electrical component body 14 and recess 24 during the operation of electrical component body 14 can reduce or lower the temperature and/or rail bounce of the IC die within electrical component body 14. For example, there is an electrical and/or thermal conduction path from electrical component body 14 through an interface material positioned in plated recess 24 and the interfacial gap between electrical component body 14 and recess 24 and into PB 12. Depending on the configuration of PB 12 and the conductor layers connected by plated recess 24, electrical and/or thermal conduction occurs from the electrical component body 14 through the interface material into one or more conductor layers of PB 12. In this way, plated recess 24 and an appropriate interface material may be used to reduce the operating temperature and rail bounce of an IC die in electrical component body 14. In addition, electrical and/or thermal conduction may occur at the interface between portions of electrical component body 14 and surface 20 of PB 12.

Figure 2:
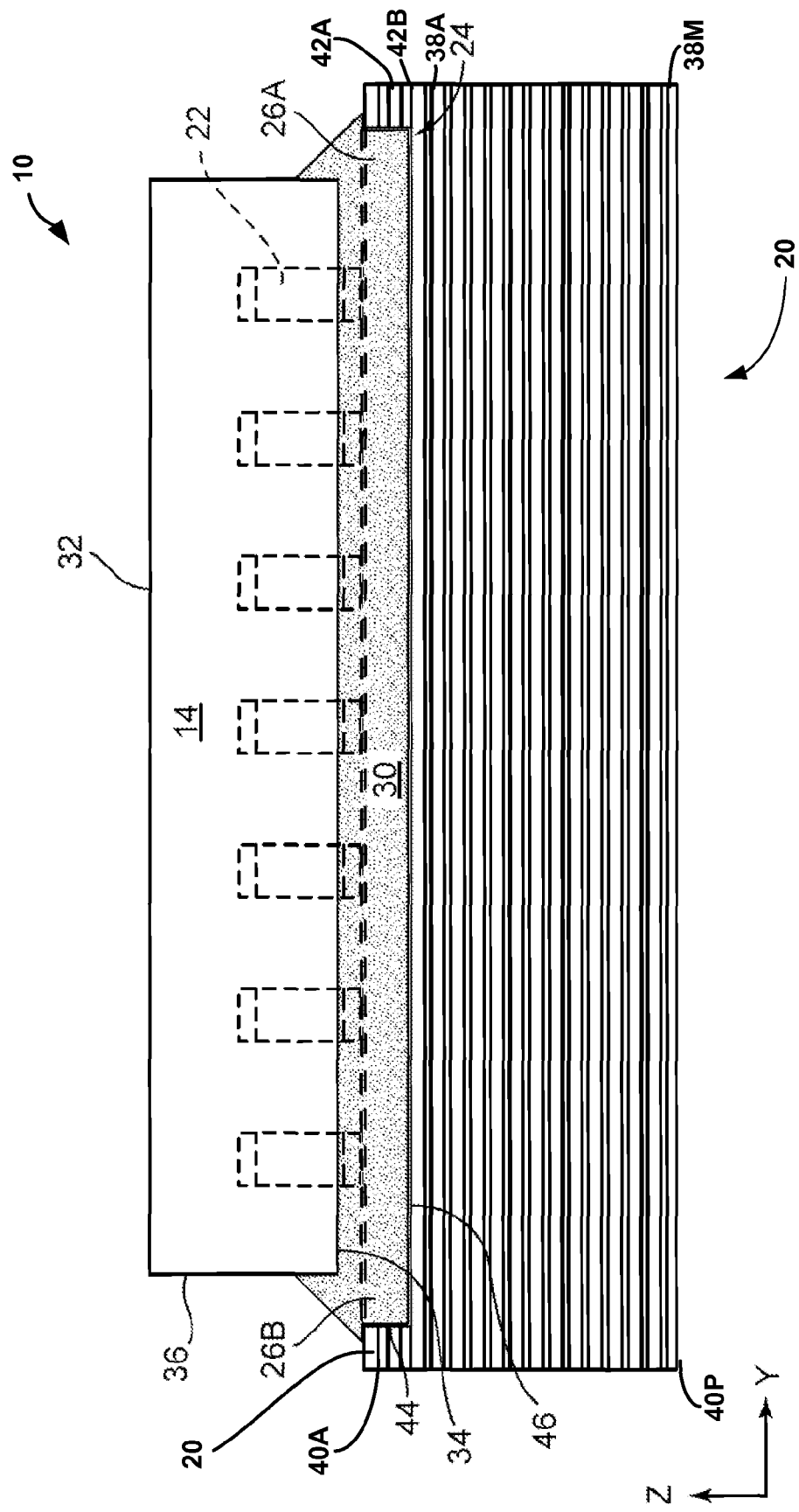
FIG. 2 is a schematic diagram illustrating the A-A cross-section view of the electrical component assembly 10 in FIG. 1.
Figure 3:
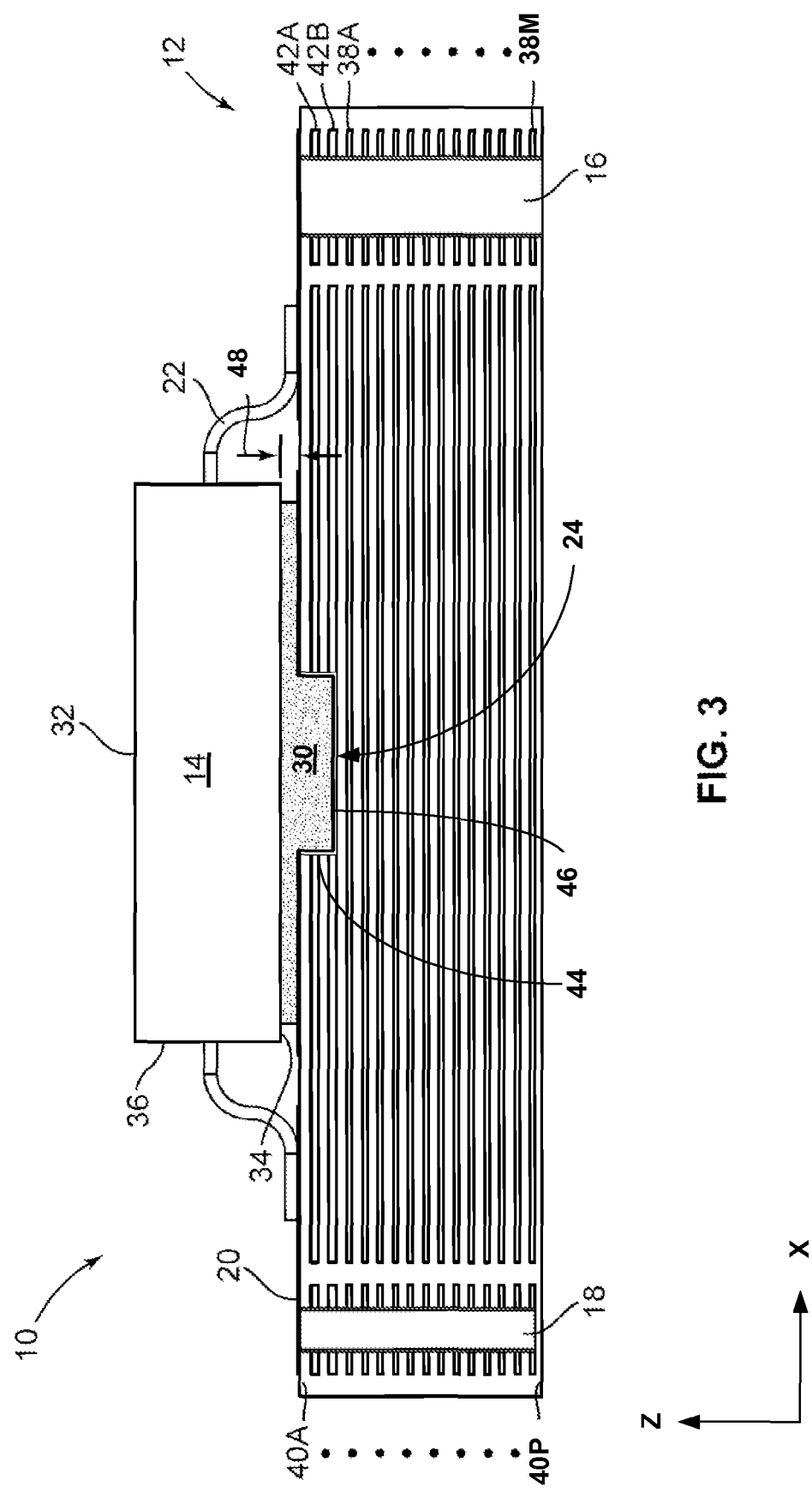
FIG. 3 is a schematic diagram illustrating the B-B cross-section view of electrical component assembly 10 in FIG. 1.

FIG. 2 is a schematic diagram illustrating an A-A cross-section view of assembly 10 in FIG. 1. FIG. 3 is a schematic diagram illustrating a B-B cross-section view of assembly 10 in FIG. 1. As shown in FIGS. 2 and 3, electrical component body 14 is mounted on a footprint defined in a conductor layer on surface 20 of PB 12. Electrical component body 14 includes a top surface 32, a bottom or interfacial surface 34, and at least one sidewall surface 36 extending from the top surface 32 to bottom surface 34. Electrical component body 14 extends over a portion of plated recess 24, which is formed in and below surface 20 of PB 12. Interface material 30 fills plated recess 24 within the gap between bottom interfacial surface 34 of electrical component body 14 and the sidewalls & bottom of plated recess 24.

When assembly 10 is assembled as shown in FIGS. 1, 2 and 3, electrical and/or thermal conduction from the IC die within electrical component body 14 through bottom interfacial surface 34 to the interfacial surfaces of PB 12 and plated recess 24 occurs during the operation of electrical component body 14. Depending on the configuration and materials of assembly 10, electrical and/or thermal conduction occurs from bottom interfacial surface 34 of electrical component body 14 through interface material 30, and into the conductor layer at surface 20 of PB 12 and the sidewall and bottom conductor surfaces of plated recess 24. Electrical and/or thermal conduction may also occur from bottom interfacial surface 34 of electrical component body 14 through interface 30 and across sidewall conductor surfaces of plated recess 24 (e.g., surface 44) into one or more connected conductor layers of PB 12. In some examples, PB 12 may include one or more thermal conductor layers configured to serve primarily as electrically isolated thermal conduction pathways to transfer heat out of component 14 and other electrical and non-electrical components. As will be described below, such thermal conductor layers may form at least a portion of the sidewall conductor surfaces of plated recess 24 to conduct heat out of electrical component body 14 through interface material 30.

As described above, PB 12 includes plated recess 24 in the component body attach pad of a component footprint defined in a conductor layer on surface 20. Plated recess 24 may have suitable size and shape, examples of which are described in greater detail below with respect to FIGS. 4 and 5. As shown in FIGS. 1, 2 and 3, plated recess 24 extends below the X-Y plane defined by surface 20 of PB 12. In some examples, recess 24 may be defined by one or more grooves, trenches, or depressions in surface 20 of PB 12. In some additional examples, recess 24 may be defined as a cavity in PB 12. For example, when assembly 10 is assembled, at least a portion of plated recess 24 may be defined as a cavity bounded on one three sides by PB 12 and on a forth side by bottom interfacial surface 34 of electrical component body 14. As will be described below, during the fabrication of assembly 10, interface material 30 may be introduced into plated recess 24, and plated recess 24 may be configured to convey interface material 30 between bottom interfacial surface 34 of electrical component body 14 and plated recess 24. In these examples, plated recess 24 may define one or more flow pathways that allow interfacial material 30 to flow into the interfacial volume between plated recess 24 and electrical component body 14. Additionally, a flow pathway may be defined such that interface material 30 is conveyed into any gaps between electrical component and surface 20 of PB 12, e.g., in the areas adjacent to plated recess 24. In some examples (not shown), plated recess 24 may extend all the way through the PB and be located at an edge of PB 12.

Plated recess 24 may define a variety of different shapes to receive and direct the flow of interface material 30. As seen in FIGS. 1, 2 and 3, plated recess 24 may define substantially rectangular cross-sections in the X-Y, Y-Z and X-Z planes, respectively. In other examples, recess 24 may define a curved (e.g., circular, elliptical) cross-section, a different polygonal (e.g., square, triangular) cross-section, or even a combination of cross-sectional shapes in the X-Y plane. As will be described further below, a surface defining plated recess 24 (e.g., sidewall surface 44 extending in the Z-direction of FIGS. 1, 2 and 3 from the component body attach pad defined in the conductor layer on surface 20 of PB 12 to bottom surfaces 46 extending in the approximately X-Y directions of plated recess 24 of FIG. 1) may be electrically and/or thermally connected to one or more conductor layers of PB 12. During operation of assembly 10, electrical and/or thermal energy conduction occurs between bottom interfacial surface 34 of electrical component body 14, through interface material 30 and through wall surfaces 44 and/or bottom surface 46 defining plated recess 40, and into connected conductor layers of PB 12. This electrical and/or thermal conduction may reduce the temperature and/or rail bounce of an IC die within electrical component body 14 during operation.

When fabricating assembly 10, electrical component body 14 may be placed on PB 12 such that bottom interfacial surface 34 of electrical component body 14 extends over at least a portion of plated recess 24. For example, as seen in FIG. 3, electrical component body 14 may bridge plated recess 24 such that one portion of bottom interfacial surface 34 of electrical component body 14 is just a small gap away from the component body attach pad defined on both sides of plated recess 24 in the conductor layer on surface 20 of PB 12.

In some examples, electrical component body 14 may be positioned over plated recess 24 such that plated recess 24 is offset from the center of bottom interfacial surface 34 of electrical component body 14. In other examples, electrical component body 14 may be positioned over plated recess 24 such that the center of bottom interfacial surface 34 of component 14 is approximately centered over plated recess 24. Electrical component body 14 may generate more heat at the center of the component than towards the peripheral surfaces (e.g., in the X-Y plane) of the component. Accordingly, in these examples, positioning the center of bottom interfacial surface 34 of electrical component body 14 over the center of recess 24 may improve electrical and/or thermal conduction between electrical component body 14 and PB 12 relative to a configuration in which the center of bottom interfacial surface 34 is not centered over the center of plated recess 24. During subsequent operation of such an assembly, electrical and/or thermal conduction from the bottom interfacial surface 34 of electrical component body 14 (including the center of bottom interfacial surface 34) through the interfacial material 30 positioned within plated recess 24 and into the connected conductor layers of PB 12 may reduce the temperature and rail bounce of the IC die within electrical component body 14. It should be appreciated that the preceding description of electrical and/or thermal conduction between bottom interfacial surface 34 of electrical component body 14 is intended to be illustrative only, and the assemblies and techniques of this disclosure are not limited in this respect. In different applications, assembly 10 may be configured to transfer thermal energy away from a different surface of electrical component body 14 such as, e.g., sidewall 36, in addition to bottom interfacial surface 34.

The size, shape and depth of recess 24 and how electrical component body 14 is positioned over recess 24, is such that the bottom interfacial surface 34 of electrical component body 14 may only partially cover recess 24 such that a portion of recess 24 extends beyond the body of electrical component body 14 (again in the X-Y plane illustrated in FIG. 1). In this example, assembly 10 may include one or more apertures that may be used to introduce interface material 30 into recess 24. As seen in FIG. 2, recess 24 may extend beyond sidewall 36 of electrical component body 14 to define aperture 26 for introducing interface material 30 into recess 24. Aperture 26 may be an opening between electrical component body 14 and PB 12 that is in fluid communication with recess 24, allowing interface material 30 to be introduced from outside of component assembly 10 and PB 12 into recess 24.

In examples where assembly 10 includes aperture 26, recess 24 may extend beyond the edges of electrical component body 14 in a single direction (e.g., to define a single aperture 26) or multiple directions (e.g., to define two, three, or more apertures). For example, as shown in the example of FIG. 2, recess 24 may extend beyond electrical component body 14 in two directions to define two apertures 26A and 26B. An assembly that includes multiple apertures may allow interface material 30 to be introduced between electrical component body 14 and PB 12 within recess 24 from multiple directions. This may improve the distribution of interface material 30 between interfacial surfaces between electrical component body 14 and recess 24, as well as between electrical component body 14 and surface 20 of PB 12, relative to an assembly that only includes a single aperture for introducing interface material 30 into recess 24.

Figure 10:
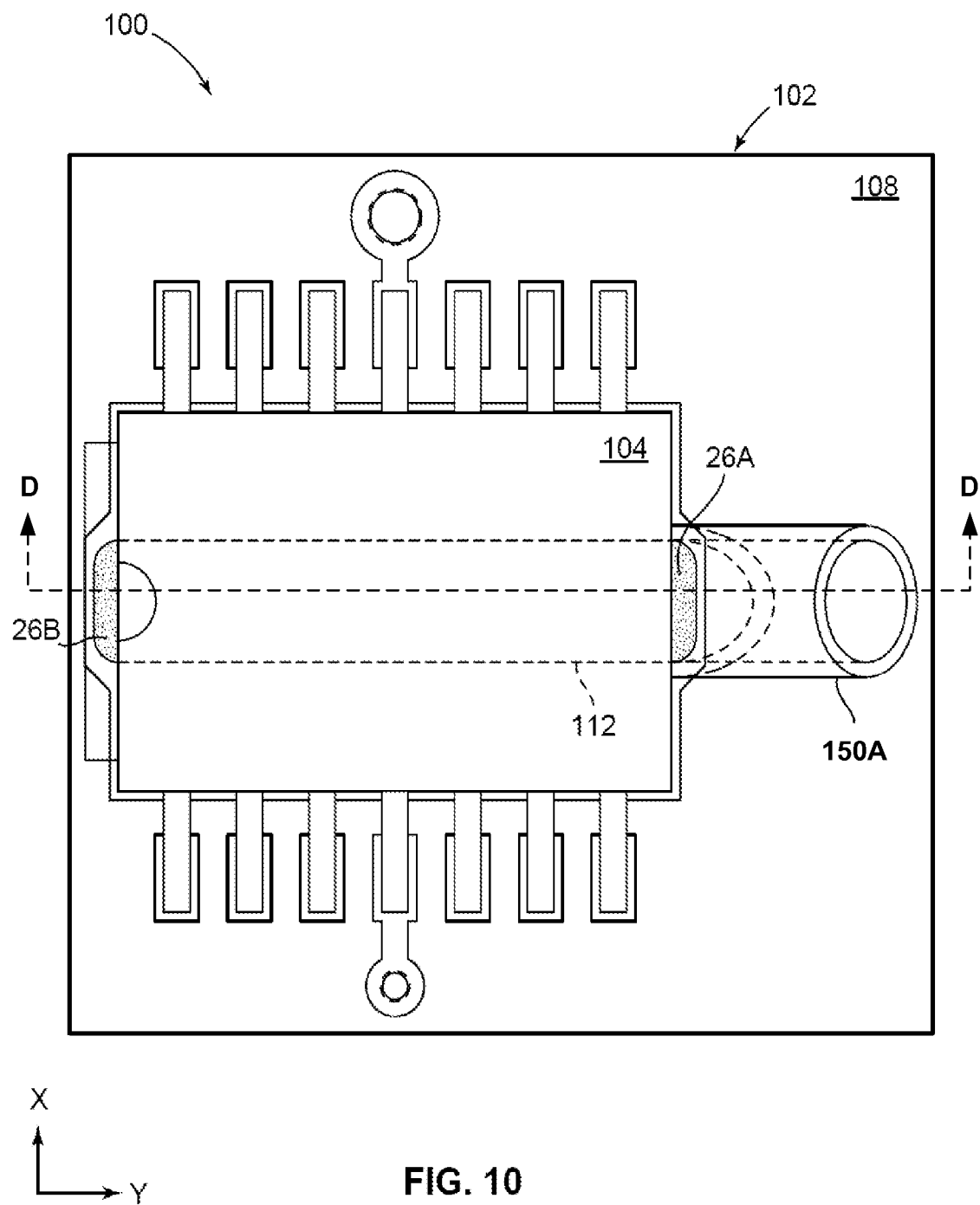
FIG. 10 is a schematic diagram illustrating the top view of the example printed board of FIG. 8 with an electrical component mounted on the PB and with an injection adapter positioned at one aperture for interface material injection.

Assembly 100 of FIG. 10 may include apertures 26 that define any suitable size. Further, the specific dimensions of apertures 26 may vary, e.g., depending on the dimensions of PB 12, the dimensions of electrical component body 14, the proximity of other components and the flow characteristics of interface material 30. For example, larger apertures 26 may be used for a more viscous interface material, while smaller apertures 26 may be used for a comparatively less viscous interface material. In some examples, aperture 26A and 26B may each define an opening of approximately 5 square mils. Other aperture sizes and shapes are possible and contemplated.

When assembly 10 is assembled as shown in FIGS. 1, 2 and 3, interface material 30 may be positioned between interfacial surfaces of electrical component body 14 and recess 24 to create an interfacial electrical and/or thermal conduction pathway between the bottom surface 34 of electrical component body 14 to PB 12. In some examples, interface material 30 may also serve to mechanically attach or adhere electrical component body 14 to PB 12. Interface material 30 may include both electrically and thermally conductive, electrically insulating and thermally conductive or both electrically and thermally insulating (e.g. for mechanical only bonding) types. One example interface material may include the electrically non-conductive and thermally conductive Arathane 7760 material manufactured by Huntsman Advanced Materials Americas, Inc. Los Angeles, Calif. 90039. Although other interface material 30 types are contemplated, and the disclosure is not limited in this respect.

Any suitable amount of interface material 30 may be used in assembly 10. In some examples, as discussed above, interface material 30 may fill separation recesses and gaps between electrical component body 14 and PB 12 that may otherwise be filled with air or another gas. In these examples, enough interface material 30 may be positioned between electrical component body 14 and PB 12 to displace any air or other gas residing in the recesses and separation gaps between electrical component body 14 and PB 12. For instance, in some examples, interface material 30 may define an interfacial Z-direction thickness 48 (as indicated on FIG. 3) between approximately 5 mils and approximately 15 mils, although other thicknesses are possible.

Interface material 30 may be positioned between PB 12 and substantially the entire interfacial surface of electrical component body 14 body adjacent to PB 12 (bottom interfacial surface 34 in the example of FIGS. 2 and 3) or between PB 12 and a lesser portion of the surface of electrical component body 14 body adjacent to PB 12. Depending on the configuration of assembly 10, electrical and/or thermal conduction is provided from substantially the entire bottom interfacial surface 34 of electrical component body 14 into PB 12. As the electrical/thermal impedance of the interface material is proportional to its bulk electrical/thermal resistivity times its cross-section area divided by its path (gap) length, increasing the area and decreasing the gap, reduces the electrical/thermal resistance and increases electrical/thermal conduction. Positioning interface material 30 between PB 12 and substantially filling the entire interfacial volume between electrical component body 14 and PB 12 (e.g., the volume defined by component body bottom surface 34, interfacial gap 48 and recess 24 in the example of FIGS. 1, 2 and 3) may increase electrical and/or thermal conduction between electrical component body 14 and PB 12 relative to a configuration of assembly 10 in which interface material 30 is not positioned between PB 12 and substantially the entire interfacial volume between electrical component body 14 and PB 12.

Electrical component body 14 is mounted on PB 12. In general, electrical component body 14 can be mounted on any suitable type of PB. For example, as seen in FIGS. 2 and 3, electrical component body 14 may be mounted on a PB that includes a plurality of circuit conductor layers 38A-38M and thermal conductor layers 42A-42B (collectively referred to as "conductor layers 38 and 42, respectively") and a plurality of insulating layers 40A-40P (collectively referred to as "insulating layers 40"). Conductive layers 38 and 42 may extend across at least a portion of PB 12 (e.g., in the Y-direction illustrated in FIG. 2, and the X-direction illustrated in FIG. 3). Conductor layers 38 and 42 may be configured to conduct electrical energy (e.g., electrical processing signals, power, ground, or the like) and/or thermal energy to and/or from electrical component body 14 during the operation of the component. With this in mind, conductor layers 38 and 42 may be fabricated from an electrically and thermally conductive material such as, e.g., copper (Cu). By contrast, insulating layers 40 may insulate different layers of conductor layers 38 and 42 from one another. This may prevent different layers of conductor layers 38 and 42 from shorting out or interfering with one another. In this regard, insulating layers 40 may be fabricated from an insulating material such as, e.g., a dielectric material.

As noted above, in some examples, PB 12 may also include one or more conductor layers dedicated to thermal conduction, which in the example of FIGS. 2 and 3 are illustrated as two thermal conductive layers 42A and 42B (collectively referred to as "thermal conductor layers 42"). In some examples, one or more conductor layers may function as both thermal and circuit conduction layers. In other words, a conductor layer in PB 12 may be capable of conducting both electrical energy and thermal energy. In other examples, thermal conductor layers 42 may be electrically isolated from circuit conductor layers 38. Electrically isolating thermal conductor layers 42 from circuit conductor layers 38 may improve the electrical operation of assembly 10, e.g., by isolating and minimizing interaction between electrical and thermal pathways.

It should be appreciated that while the techniques of the disclosure are described with example electrical component 10 and PB 12 in FIGS. 1, 2 and 3, in other applications, an assembly according to the disclosure may be fabricated using any type of component and PB, and the disclosure is not limited to a specific type of component or PB. For instance, in some examples, a PB may include one or more vias extending at least partially through the PB. For example, as illustrated in FIGS. 1 and 3, PB 12 may include one or more through vias 16 and one or more blind vias 18. Blind via 18 and/or through via 16 may be used to establish an electrical connection between electrical component body 14 and one or more of circuit conductor layers 38 or thermal conductor layers 42. Additionally or alternatively, through via 16 and/or blind via 18 may be used to establish an electrical connection between electrical component body 14 and another electrical component mounted on PB 12 (e.g., in examples where multiple electrical components are mounted on PB 12). In some examples, through via 16 and/or blind via 18 may be configured to conduct thermal energy from electrical component 18 to thermal conductive layers 42 in addition to or in lieu of conducting electrical energy. In such examples, through via 16 and/or blind via 18 may be referred to as a thermal via instead of an electrical via. Other via types contemplated but not shown include micro vias (e.g., laser drilled micro vias) and buried vias (e.g., vias that do not extend to either PB surface). Alternative configurations of PB 12 are both possible and contemplated, however, and it shall be understood that the disclosure is not limited in this respect.

As discussed above, recess 24 may extend below surface 20 of PB 12 (in the Z-direction as indicated in FIGS. 2 and 3) to which electrical component body 14 is mounted. In some such examples, the component body attach pad defined in the conductor layer on surface 20 that defines recess 24 may be connected to one or more thermal conductor layers 42 of PB 12. For example, as seen in FIG. 3, plated sidewall surface 44 and plated bottom surface 46 defining plated recess 24 may be connected to thermal conductor layers 42 in PB 12. Depending on the configuration of PB 12, one or both of thermal conductor layers 42 may define at least a portion of the sidewall surface 44 and/or bottom surface 46 of plated recess 24. For example, plated recess 24 may be machined, milled or otherwise formed in PB 12 such that sidewall surface 44 and/or bottom surface 46 defining recess 24 may transect one or both of thermal conductor layers 42. As a result, the portion of thermal conductor layers 42 that would otherwise extend though recess 24 may be removed from PB 12 during the fabrication of recess 24. This may allow the exposed edges of one or both of thermal conductor layers 42 to define at least a portion of sidewall surface 44. Additionally or alternatively, thermal conductor layer 42 may form the bottom surface 46 of recess 24. Bottom surface 46 bridges the "hole" defined in various thermal conductors layer 42 by forming recess 24. In such examples, thermal energy may transfer directly from interface material 30 disposed in recess 24 to thermal conductor layers 42 of PB 12, which may dissipate thermal energy generated by electrical component body 14 during the operation of the electrical component.

In some examples, a surface defining recess 24 may include a layer of thermally conductive material. For example, sidewall surface 44 and/or bottom surface 46 defining recess 24 may be plated with a layer of electrically and thermally conductive material such as, e.g., copper, nickel, tin, aluminum, or the like. Such a plating may increase the amount of area of sidewall surface 44 and/or bottom surface 46 through which thermal energy transfers to thermal conductor layers 42 relative to an example assembly in which sidewall surface 44 and/or bottom surface 46 are not plated with an electrically and thermally conductive material. In some examples, sidewall surface 44 and/or bottom surface 46 may be plated with a layer of electrically and thermally conductive material between approximately 0.5 mils (0.0005") and approximately 2 mils (0.002") thick, although other thicknesses are possible.

As described above, recess 24 may define any suitable size and shape. FIGS. 4A and 4B are conceptual diagrams illustrating top and C-C cross-section views of one example recess 50 that may be used in the example assembly of FIGS. 1-3.

FIG. 4A illustrates a conceptual top view of an example recess 50 that extends below the X-Y plane defined by surface 20 of PB 12. FIG. 4B illustrates an C-C cross-section view of recess 50 in FIG. 4A. Recess 50 is an example of recess 24 (FIGS. 1-3). The PB conductor layers and recess plating are not shown in FIGS. 4A and 4B.

As seen in FIGS. 4A and 4B, recess 50 may define a substantially rectangular or other cross-section in the X-Y plane and a rectangular cross-section in the X-Z plane. In other examples, recess 50 may define a curved (e.g., circular, elliptical) cross-section, a different polygonal (e.g., triangular, hexagonal) cross-section, or even a combination of cross-sectional shapes in the X-Y plane. The cross-section in the X-Z plane will be substantially rectangular for efficient interfacing with specific PB conductor layers. In this regard, the disclosure is not limited to a recess that defines a particular cross-sectional shape.

Recess 50 may be used to position interface material 30 (not shown in FIGS. 4A and 4B) between electrical component body 14 and PB 12 and recess 50. Accordingly, the specific dimensions of recess 50 may vary, e.g., based on the component, the PB, the shape of recess 50 and the flow characteristics of interface material 30. In the example of FIGS. 1-3, recess 50 may defines a length 52 of approximately 414 mils (0.414") and a width 54 of approximately 80 mils (0.080") and a depth 56 extending below surface 20 of PB 12 of approximately 15 mils (0.015"). Such an example recess may be used to position interface material 30 between electrical component body 14 and PB 12 and recess 50.

As discussed above, electrical component body 14 may generate more heat at the center of the component than towards the peripheral surfaces of the component. For this reason, electrical component body 14 may be positioned over recess 50 such that a center of the electrical component is centered over recess 50. In such an example configuration, thermal energy may transfer from the center of electrical component body 14, through interface material 30 positioned in recess 50 and interfacial gap 48 between electrical component body 14 and PB 12, and into PB 12.

In such example assemblies, recess 50 may be designed so that interface material 30 is positioned between a center 58 of electrical component body 14 and center of recess 50 in PB 12. For example, as shown in FIG. 4A, center 58 of electrical component body 14 may be positioned over center of recess 50 that defines a substantial constant width 54 in the X-Y plane. In another example, width 54 of recess 50 may increase in the region at the proximate center 58 of electrical component body 14. For example, recess 50 may define one or more narrow widths that extend beyond electrical component body 14 (e.g., in the X-Y plane indicated on FIG. 4A) and a comparatively wider width under center 58 of electrical component body 14.

As described before, electrical component body 14 may be positioned to cover some but not all of recess 50. In this manner, recess 50 and component 14 may define an aperture used to introduce interface material 30 into the interfacial volume between the surface of PB 12, the sidewall and bottom surfaces of recess 50 and the bottom surface of component 14. For example, during the fabrication of such an assembly, interface material 30 may be introduced into the one or more apertures formed by the narrow widths that extend beyond electrical component body 14. Thereafter, interface material 30 may flow along length 52 of recess 50 to fill the comparatively wider width of recess 50 over which center 58 of electrical component body 14 is positioned. In this manner, recess 50 may be used to position more interface material 30 under center 58 of electrical component body 14 than at the peripheral regions of electrical component body 14 (e.g., the peripheral regions in the X-Y plane).

Figure 5:
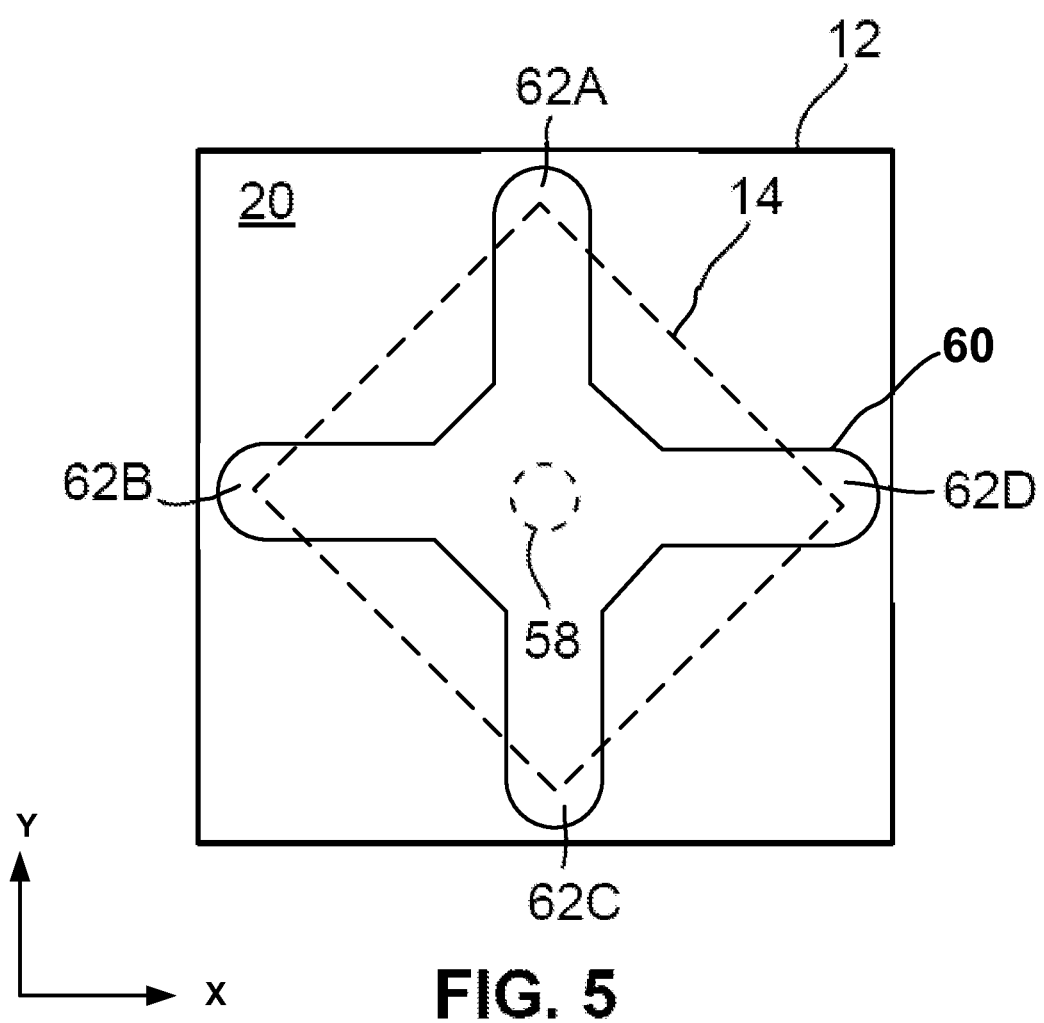
FIG. 5 is a conceptual diagram illustrating a top view of another example plated recess that may be used in an electrical component assembly (e.g., where the electrical component has a quad flat pack package).

FIG. 5 is a conceptual diagram illustrating a top view of another example recess 60 that may be used in the example assembly of FIG. 1. Recess 60 is an example of recess 24 (FIGS. 1-3) and recess 50 (FIGS. 4A and 4B), and may define a variety of different cross-sectional shapes and sizes, as discussed above. As shown in FIG. 5, recess 60 may include a plurality of apertures 62A-62D (collectively "apertures 62") that extend below the X-Y plane defined by surface 20 of PB 12 and beyond the corners of the body of component 14 to allow access to recess 60 below component 14. Apertures 62 may be bounded in the Z-direction by the body of electrical component body 14. In some examples, each cavity of cavities 62 may be separate. For example, each aperture of apertures 62 may provide an unconnected flow path for individual recesses that may be used to position interface material 30 between PB 12, recess 60 and a portion of electrical component body 14. In other examples, as seen in FIG. 5, all apertures of apertures 62 may connect to a common recess 60. For example, each aperture of apertures 62 may be connected in the region at proximate center 58 of electrical component body 14. Such an example arrangement may be used to position interface material 30 under center 58 of electrical component body 14 which, as discussed above, may generate more heat than more peripheral regions of electrical component body 14. It should be appreciated, however, that recess 50 (FIGS. 4A and 4B) and recess 60 (FIG. 5) are merely examples of recess 24 (FIGS. 1-3), and the disclosure is not limited to an assembly that includes a specific recess according to the example of either FIG. 4 or 5.

Figure 6:
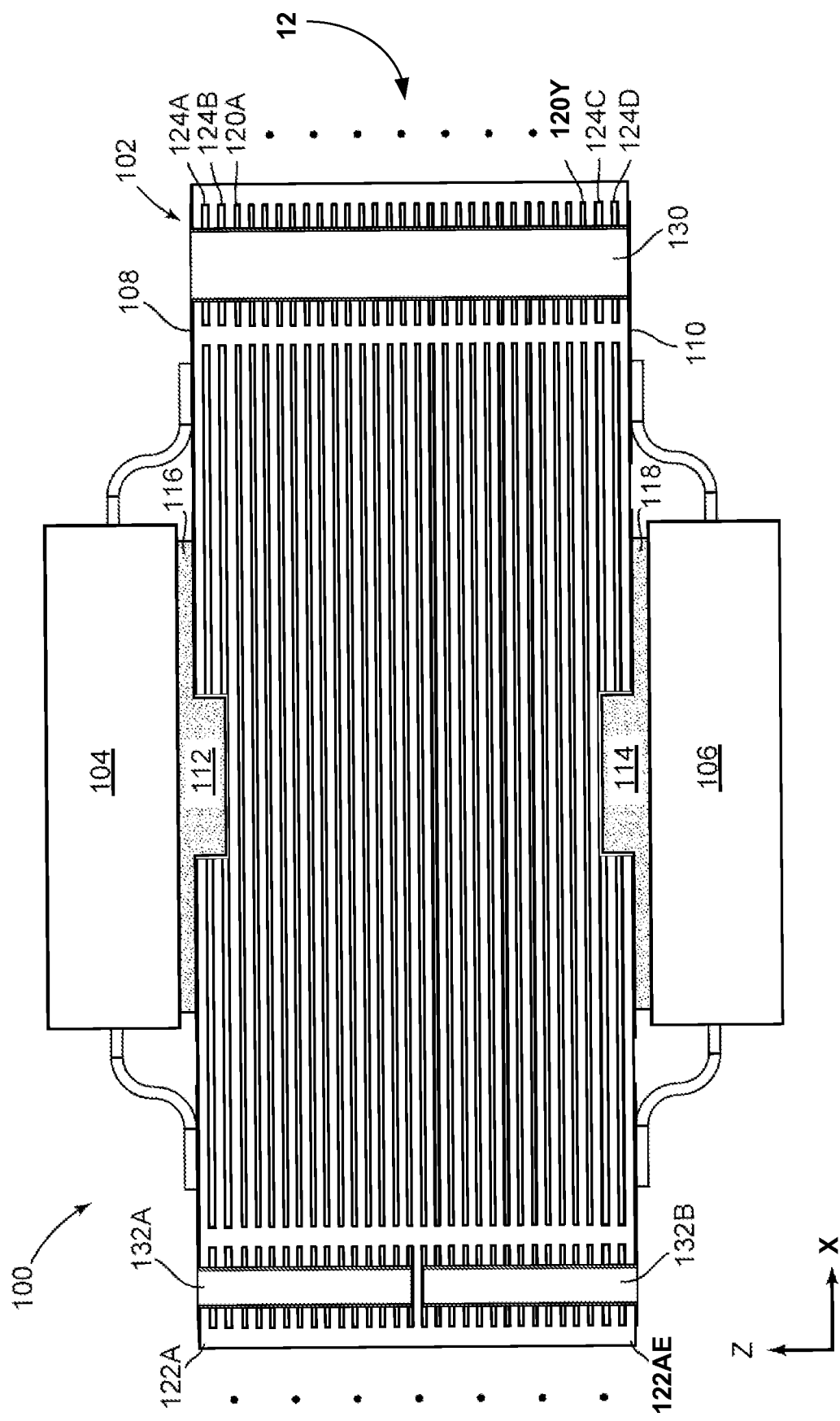
FIG. 6 is a conceptual diagram illustrating a cross-section view of another example electrical component assembly (along the Z-Y plane) that is similar to electrical component assembly in FIG. 1 but with an electrical component mounted on both first and second PB surfaces.

FIG. 6 is a conceptual diagram illustrating a cross-sectional view of another example electrical component assembly 100 (along the Z-Y plane) that is similar to assembly 10 of FIG. 1 but with components mounted directly opposite each other on opposite PB surfaces. For references, the example PB cross sections depicted in FIGS. 2 and 3 are approximately half of the PB cross sections depicted in FIG. 6 (as well FIGS. 8, 9, and 11) in terms of thickness and number of conductor/dielectric layers.

In the example of FIG. 6, assembly 100 includes PB 102, first electrical component body 104, and second electrical component body 106. PB 102 defines first surface 108 and second surface 110, which is opposite first surface 108. First electrical component body 104 is mounted to first surface 108, and second electrical component body 106 is mounted to second surface 110. PB 102 is an example of PB 12 (FIGS. 1-3), while first electrical component body 104 and second electrical component body 106 are examples of electrical component body 14 (FIGS. 1-3). First electrical component body 104 and second electrical component body 106 may be the same type of electrical component, or first electrical component body 104 may be different than second electrical component body 106.

PB 102 also includes first plated recess 112 and second plated recess 114. First plated recess 112 is defined in first surface 108 of PB 102. Second plated recess 114 is defined in second surface 110 of PB 102. First plated recess 112 and second plated recess 114 are examples of recess 24 (FIGS. 1-3). First plated recess 112 may be used to position first interface material 116 (hereinafter "IM 116") between first electrical component body 104 and PB 102, while second plated recess 114 may be used to position second interface material 118 (hereinafter "IM 118") between second electrical component body 106 and PB 102. First IM 116 and second IM 118 are examples of IM 30 (FIGS. 1-3), and in different examples, first IM 116 may be the same as second IM 118, or first IM 116 may be different than second IM 118.

First plated recess 112 and second plated recess 114 may each define one or more apertures in combination with components 104 and 106, respectively, for introducing first IM 116 and second IM 118 between first electrical component body 104 and PB 102 and between second electrical component body 106 and PB 102, respectively. For example, first plated recess 112 may extend beyond first electrical component body 104 and second plated recess 114 may extend beyond second electrical component body 106 to each define one or more apertures (similar to apertures 26 described above with respect to FIGS. 1-3). During the fabrication of such an example assembly, first IM 116 may be introduced into an aperture defined by first component body 104 and first plated recess 112, and first plated recess 112 may provide a pathway that allows first IM 116 to travel between and substantially fill the volume between the interfacial surfaces between PB 102 and first electrical component body 104. Likewise, second IM 118 may be introduced into an aperture defined by second component 106 and second plated recess 114, and second plated recess 114 may provide a pathway that allows second IM 118 to travel between and substantially fill the volume between the interfacial surfaces between PB 102 and second electrical component body 106.

As configured in the example of FIG. 6, assembly 100 may allow two or more electrical components to be mounted on opposite sides of the same PB 102 and directly opposite each other. Such an arrangement of electrical components may increase the functional density with which electrical components may be mounted to a PB.

For example, based on the configuration of first plated recess 112 and second plated recess 114, PB 102 may not require a filling or squirt hole that extends through an opposite side of PB 102 (e.g., from first side 108 to second side 110) to introduce an interface material into the interfacial volume between an electrical component body and the PB. Instead, as described above, first plated recess 112 may extend beyond the body of first electrical component 114 to define an aperture for positioning first IM 116 between first electrical component body 104 and PB 102. Second plated recess 114 may also extend beyond the body of second electrical component body 106 to define an aperture for positioning second IM 118 between second electrical component body 106 and PB 102. In some such examples, first IM 116 may be introduced from first side 108 of PB 102, while second IM 118 may be introduced from second side 110 of PB 102. As a result, an IM filling hole extending through PB 102 may be absent from assembly 100. By removing such a filling hole, electrical components may be mounted directly opposite each other without blocking access for introducing an interface material under each respective electrical component.

During the operation of assembly 100, first electrical component body 104 and/or second electrical component body 106 may generate heat. Assembly 100 may transfer the thermal energy away from the electrical components to cool the components during operation. Depending on the configuration of assembly 100, thermal energy from first electrical component body 104 may transfer from a surface of the component adjacent to PB 102, through first IM 116, through first plated recess 112, and into PB 102. Thermal energy from second electrical component body 106 may transfer from a surface of the component adjacent to PB 102 (on an opposite side from first electrical component body 104), through second IM 118, through second plated recess 114, and into PB 102. In this manner, first plated recess 112 and second plated recess 114 may be used to position an interface material between first electrical component body 104 and PB 102 and between second electrical component body 106 and pointed board 102, respectively, and to transfer thermal energy away from the components into the PB during operation.

Thermal energy may transfer from first electrical component body 104 and second electrical component body 106 into PB 102. PB 102 is an expanded example of PB 12 (FIGS. 1-3). As shown in FIG. 6, PB 102 may a plurality of electrically conductive layers 120A-120Y and a plurality of insulating layers 122A-122AE. PB 102 may also include one or more thermal conductor layers, which in the example of FIG. 6 are illustrated as four thermal conductor layers 124A-124D (collectively "thermal conductor layers 124"). Other configurations of PB 102 are both possible and contemplated.

First plated recess 112 and second plated recess 114 may each be electrically and/or thermally connected to one or more of thermal conductor layers 124 of PB 102. For instance, in one example, first plated recess 112 and second plated recess 114 may each be electrically and/or thermally connected to one or more of the same thermal conductor layers 124 in PB 102. In other examples, first plated recess 112 may be electrically and thermally connected to one or more thermal conductor layers 124 of PB 102, while second plated recess 114 may be electrically and thermally connected to one or more separate thermal conductor layers 124 of PB 102. For example, as seen in FIG. 6, first plated recess 112 may be electrically and thermally connected to thermal conductor layers 124A and 124B, while second plated recess 114 may be electrically and thermally connected to thermal conductor layers 124C and 124D. Because thermal conductor layers 124A and 124B are positioned closer to first electrical component body 104 and thermal conductor layers 124C and 124D are positioned closer to second electrical component body 106, such an example assembly may transfer thermal energy away from first electrical component body 104 and second electrical component body 106 more rapidly than an assembly in which first plated recess 112 and second plated recess 114 are electrically and thermally connected to the same thermal conductor layers.

In some examples, PB 102 may also include one or more vias extending at least partially through the PB. For example, as shown in FIG. 6, PB 12 may include one or more through vias 130 and one or more blind vias 132A and 132B. Through via 130 and/or blind vias 132A and 132B may be used to establish an electrical connection between first electrical component body 104 and one or more of circuit conductor layers 120, and/or second electrical component body 106 and one or more of circuit conductor layers 120. Additionally or alternatively, through via 130 and/or blind vias 132A and 132B may be used to establish an electrical connection between first electrical component body 104 and second electrical component body 106. In some examples, through via 130 and/or blind vias 132A and 132B may be configured to conduct thermal energy from first electrical component body 104 and/or second electrical component body 106 to thermal conductor layers 124. Alternative configurations of PB 102 are both possible and contemplated and it shall be understood that the disclosure is not limited in this respect.

Figure 7:
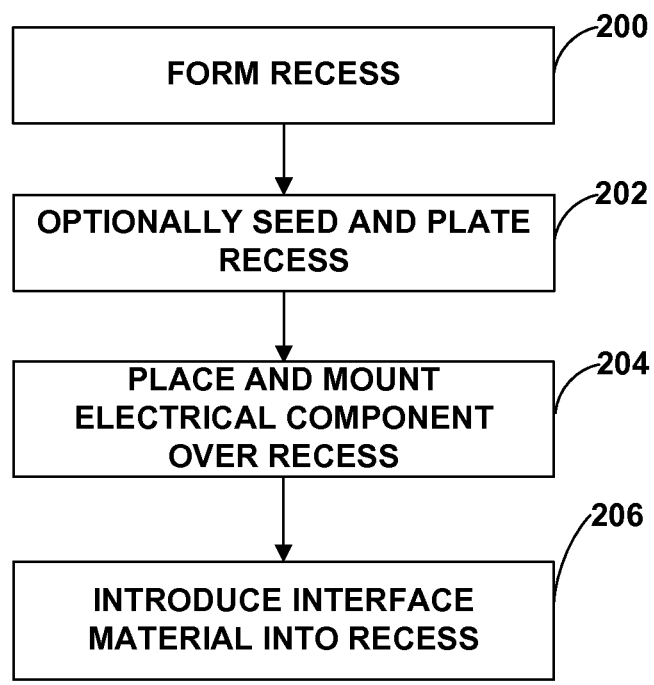
FIG. 7 is a process flow diagram illustrating an example technique for forming an example electrical component assembly.

A variety of different techniques may be used to form an example assembly according to the present disclosure. FIG. 7 is a flow diagram illustrating an example technique for forming an electrical component assembly that includes two electrical components mounted on opposite sides of a PB. For ease of description, the technique of FIG. 7 is described with reference to FIGS. 8-11, where like reference numerals refer to like features described above with respect to FIGS. 1-6.

Figure 8:
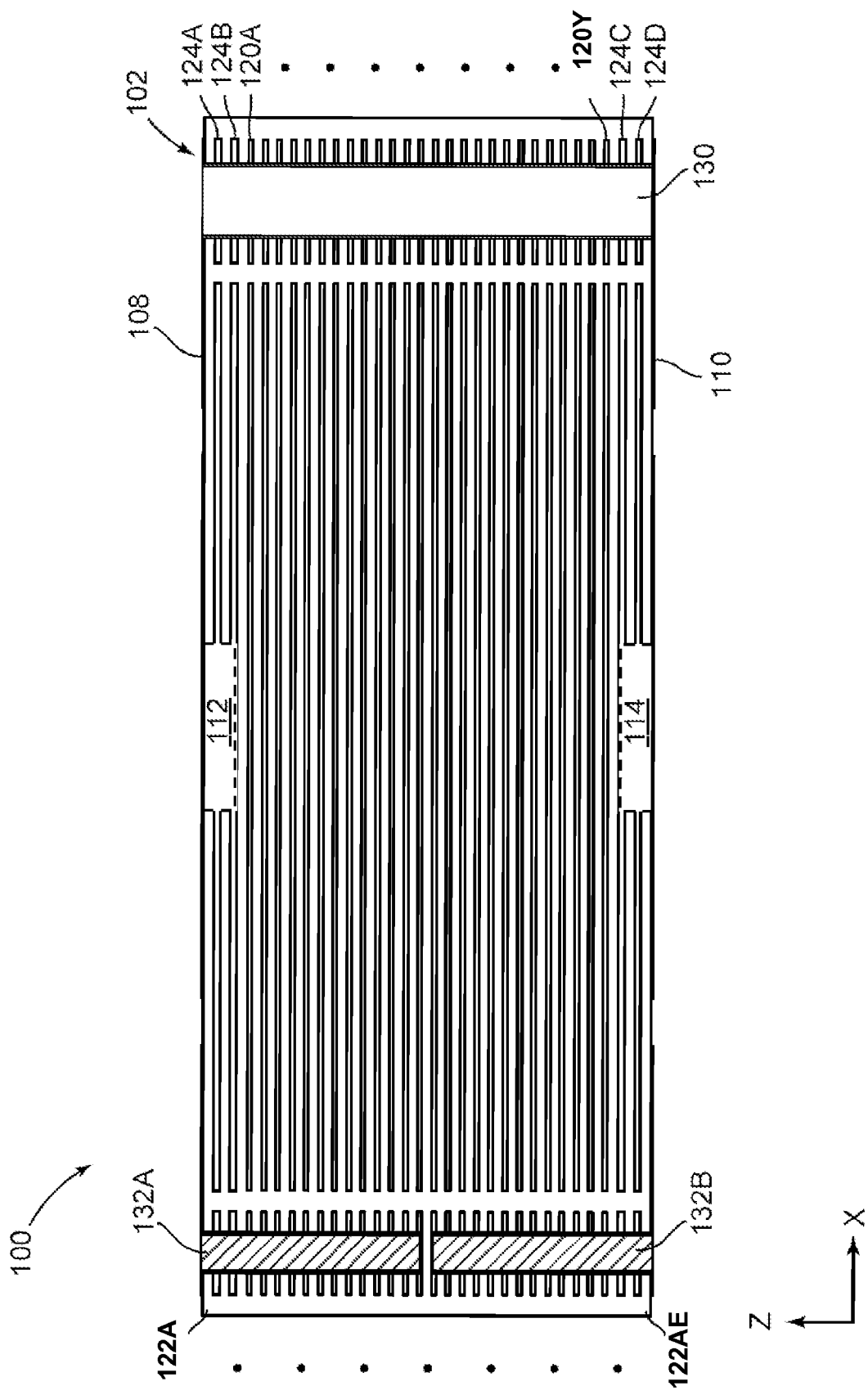
FIG. 8 is a schematic diagram illustrating the a cross-sectional view of the example printed board of FIG. 6 just after through-hole via drilling and recess forming and just before through-hole via and recess plating using the example technique of FIG. 7.

According to the example technique of FIG. 7, PB 102 in assembly 100 may be fabricated by forming first recess 112 and second recess 114 into PB 102 (step 200). For example, as shown in FIG. 8, first recess 112 may be formed into first surface 108 of PB 102, and second recess 114 may be formed into second surface 110 of PB 102. In some examples, recess formation may be combined with through via drilling. Steps 200 and 202 are performed after final lamination as of the PB fabrication process.

First recess 112 and second recess 114 may be formed into PB 102 (200) using any suitable technique. For instance, in some examples, first recess 112 and second recess 114 may each be machined, milled, drilled, cut, etched or otherwise formed into PB 102. Depending on the configuration of PB 102, first recess 112 and second recess 114 may be formed in the Z-direction indicated on FIG. 8 to remove a portion of PB 102. In such an example, one or more of insulating layers 122 and/or thermal conductor layers 124 may define at least a portion of the surfaces defining first recess 112 and second recess 114. In other examples, PB 102 may be fabricated to define first recess 112 and second recess 114, e.g., by laminating together different layers through which first recess 112 and second recess 114 are predefined (e.g., precut). In addition to forming first recess 112 and second recess 114 (200), through via 130 may be drilled through PB 102 after the different layers of the board are laminated together (in examples where PB 102 includes one or more through vias).

Figure 9:
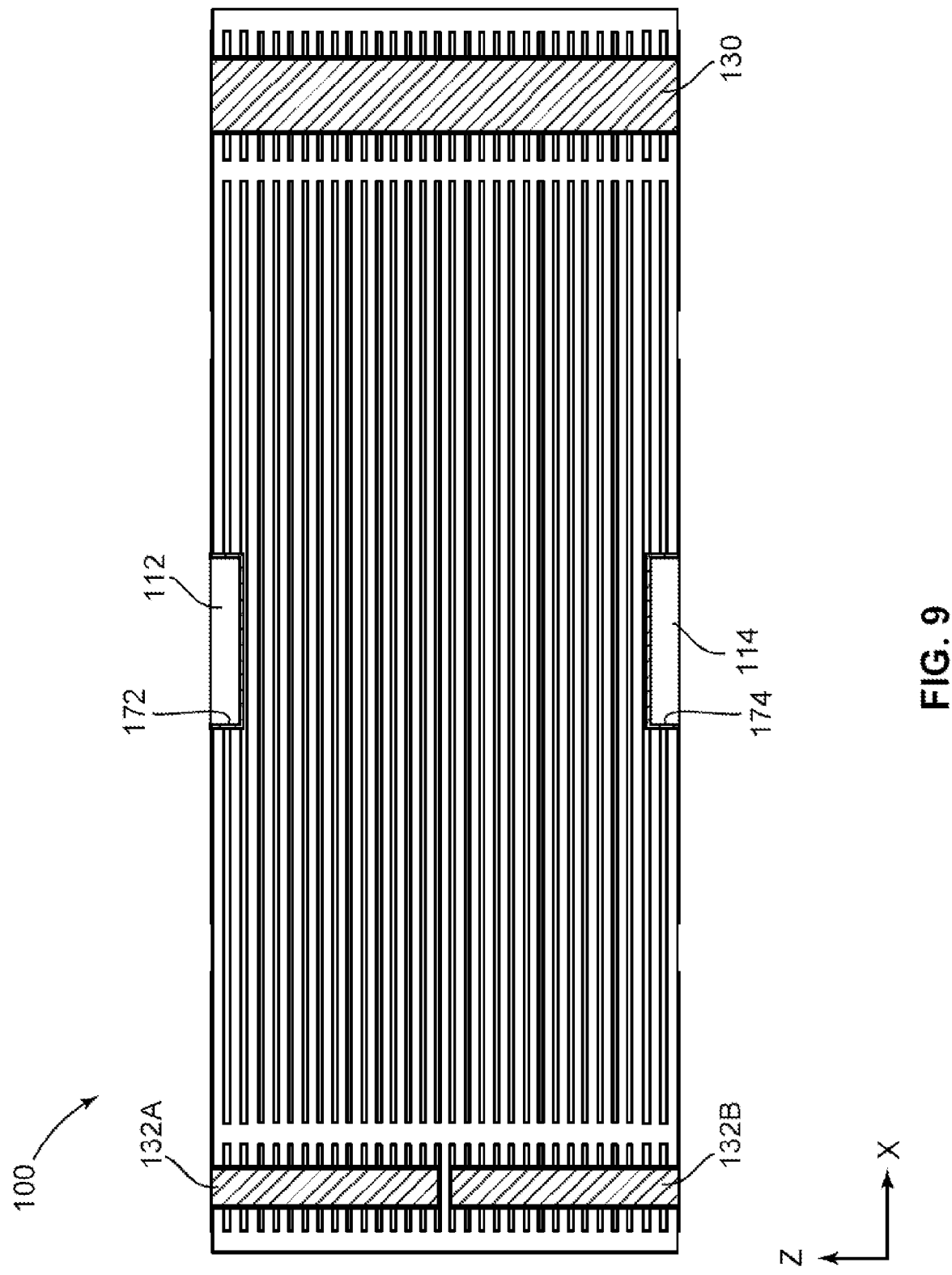
FIG. 9 is a schematic diagram illustrating the cross-sectional view of the example printed board of FIG. 6 just after through-hole via and recess plating and just before surface conductor patterning (e.g., photo-etching) using the example technique of FIG. 7.

Optionally, in some examples, after forming first recess 112 and second recess 114 (200), the recesses and drilled through holes may be collectively seeded, for example with palladium to promote adhesion and plating onto exposed dielectric surfaces, and plated with an electrically and thermally conductive material (step 202). For example, as illustrated in FIG. 9, one or more surfaces (e.g., sidewalls and bottom) of first recess 112 may be plated with a layer of electrically and thermally conductive material 172, and one or more surfaces (e.g., sidewalls & bottom) of second recess 114 may be plated with a layer of electrically and thermally conductive material 174. In one example, conductive layers 172 and 174 may each include copper. The thickness of a copper layer in such an example may vary based on the specific configuration of PB 102 of assembly 100. However, in some examples, the thickness may range from approximately 0.5 mils to approximately 2 mils. In some examples in which the plating includes copper, palladium or other suitable material may be first deposited as an adhesion/bond layer to assist with the plating on the surfaces (e.g., sidewalls and bottom) of recesses 112 and 114 (e.g., as copper may not plate direction onto a dielectric surface.

Following the forming of first recess 112 and second recess 114 (step 200) and seeding and plating of the surfaces of recesses and through holes (step 202) and all remaining PB fabrication steps (not detailed herein), first electrical component body 104 may be placed over first plated recess 112 and leads attached and second electrical component body 106 may be placed over second plated recess 114 and leads attached (step 204). In some examples, first electrical component body 104 and/or second electrical component body 106 may be placed over first plated recess 112 and/or second plated recess 114 and leads attached, respectively, such that a surface each electrical component body extends over at least a portion of first plated recess 112 and/or second plated recess 114. For example, first electrical component body 104 and/or second electrical component body 106 may be placed over first plated recess 112 and/or second plated recess 114 and leads attached, respectively, such that a center of each electrical component is positioned over at least a portion of first plated recess 112 and/or second plated recess 114. Such a configuration may help cool first electrical component body 104 and/or second electrical component body 106 in examples where first electrical component body 104 and/or second electrical component body 106 generate more heat at the center than at peripheral surfaces. Component lead attachment may be done with solder or conductive epoxy or polymer one side at a time. The copper component body attach pad in the surface component footprint may be as large or slightly larger than the component body. When an interface material fills the interfacial volume between the component body and its body attach pad, the pad collects heat from the entire bottom surface of the component body and conducts it down through the plated recess connection to PB thermal conductor layers.

In the example technique of FIG. 7, after placing first electrical component body 104 over first plated recess 112 and second electrical component body 106 over second plated recess 114 (204), first IM 116 may be introduced between first electrical component body 104 and PB 102, and second IM 118 may be introduced between second electrical component body 106 and PB 102 (step 206). For ease of description, introduction of first IM 116 between first electrical component body 104 and PB 102 and second IM 118 between second electrical component body 106 and PB 102 (206) is described with reference to the example of FIGS. 10 and 11.

Figure 11:
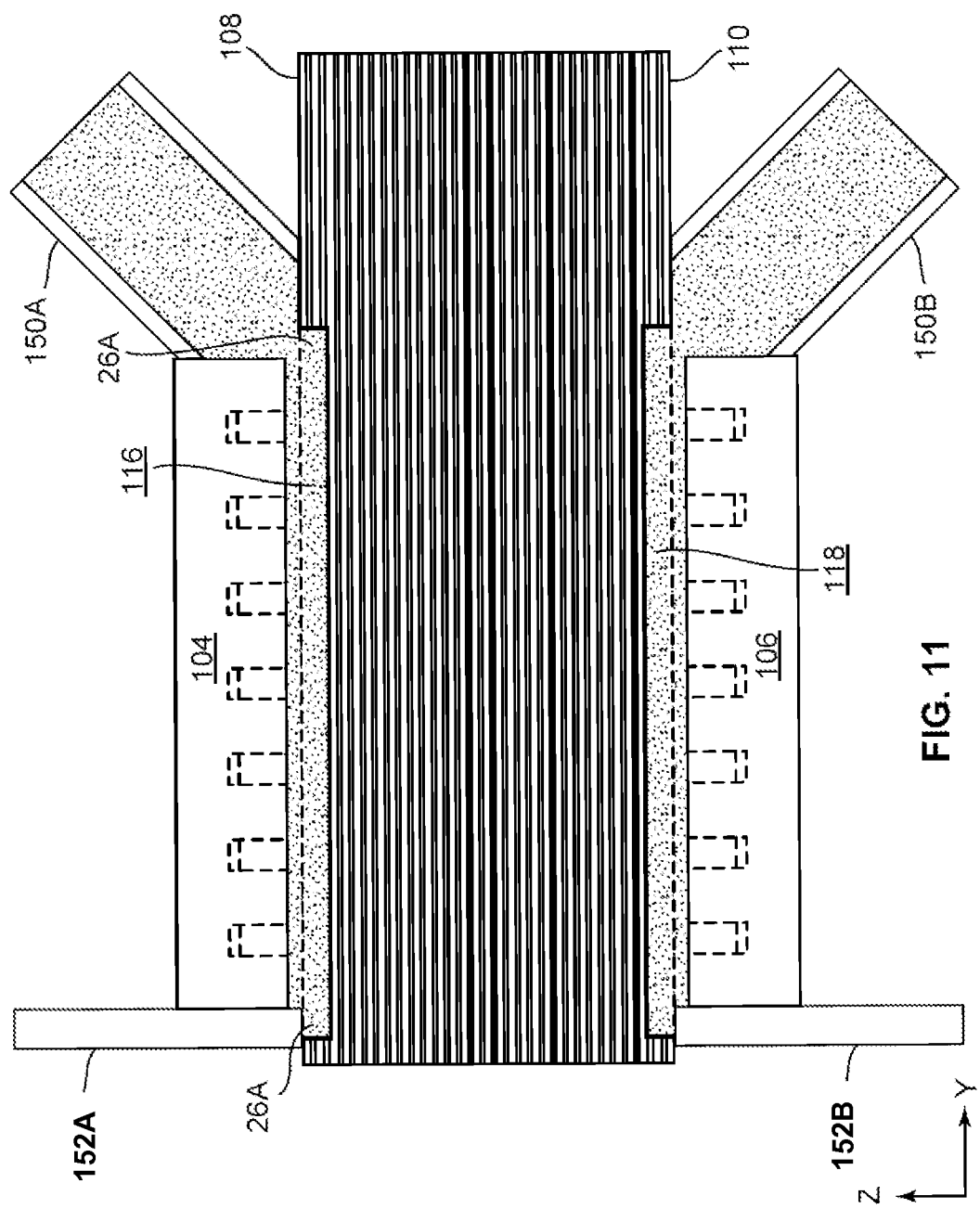
FIG. 11 is a schematic diagram illustrating the A-A cross-section view of the example printed board assembly of FIG. 10 with an injection adapter at one recess aperture end and an injection block at the other recess aperture end of electrical component assemblies at opposite PB surfaces.

FIG. 10 is a schematic top view diagram of an example assembly 100 with an example injection adapter 150A that may be temporarily provided adjacent to aperture 26A to introduce first IM 116 between interfacial surfaces of first electrical component body 104 and first surface 108 of PB 102. FIG. 11 is a D-D cross-section view diagram of the example assembly 100 of FIG. 10. Similar to that of injection adapter 150A (FIG. 10), injection adapter 150B may be used to introduce second IM 118 between the interfacial surfaces of second electrical component body 106 and PB 102. Interface materials may be cured separately or collectively (step 206).

First IM 116 and second IM 118, which may each be a flowable material such as, e.g., a liquid, a paste, or a grease, may be introduced into first plated recess 112 and second plated recess 114, respectively, via injection adapters 150A and 150B. Injection adapter tools 150A and 150B adapt the recess aperture to a syringe, pipette, nozzle, or similar standard apparatus. For example, as seen in FIG. 11, injection adapter tool 150B may be a chamfered lumen capable of conveying an interface material. In general, any suitable technique or apparatus may be used to position interface material between the interfacial surfaces of first electrical component body 104 and PB 102 and between the interfacial surfaces of second electrical component body 106 and PB 102.

As shown in FIGS. 10 and 11, injection adapter tool 150 may be positioned over a first aperture 26A, which is defined where first plated recess 112 extends beyond the body of first electrical component body 104 in the X-Y plane. Depending on the configuration of assembly 100, first aperture 26A may be in fluid communication with first plated recess 112. First plated recess 112 may also be in fluid communication with one or more additional apertures, such as second aperture 26B illustrated in FIG. 10. In such an example configuration, one or more blocking plates 152 may be positioned over the one or more additional apertures to seal first plated recess 112. Thereafter, first IM 116 may be introduced under pressure (e.g., injected) into first aperture 26A. Based on the specific configuration of first plated recess 112, first IM 116 may flow between interfacial surfaces between first electrical component body 104 and PB 102 and plated recess 112. For example, as seen in FIG. 11, first IM 116 may enter first aperture 26A and flow towards blocking plate 152 (e.g., displacing air that may exit around blocking plate 152). As first IM 116 flows towards blocking plate 152, first IM 116 may fill first plated recess 112. Depending on the configuration of first plated recess 112 and the amount of thermal interface material introduced between first electrical component 112 and PB 102, first IM 116 may flow outside of first plated recess 112 and into the interfacial gap between the component body and the PB surface (e.g., in the X-Y directions indicated on FIG. 10). In some examples, first IM 116 may be introduced until first IM 116 flows out the sides adjacent to and/or opposite from first aperture 26A.

After introducing a suitable amount of interface material through first aperture 26A, injection adapter tool 150A may be positioned over another aperture, such as second aperture 26B in the example of FIGS. 10 and 11, and blocking plate 152 may be positioned over first aperture 26A. In this manner, first IM 116 can be introduced between interfacial surfaces between first electrical component body 104 and PB 102 from a plurality of directions, which may increase the likelihood that first IM 116 is uniformly positioned between the interfacial surfaces between first electrical component body 104 and PB 102 as compared to when first IM 116 is only introduced through a single aperture. In some examples, a fillet of additional interface material may be secured over first aperture 26A and second aperture 26B after introducing first IM 116 between first electrical component body 104 and PB 102 (step 204). The fillet of additional interface material may seal the aperture for subsequent operation of the assembly. As will be appreciated by those of ordinary skill in the art, the example introduction technique outlined above with respect to first IM 116 may be repeated to introduce second IM 118 between second electrical component body 106 and PB 102. In some examples, second IM 118 may be introduced substantially simultaneously with the introduction of first IM 116 or may be introduced before or after the introduction of first IM 116.

Various examples have been described. These and other examples are within the scope of the following claims. As described above, the shape, depth and location of a machined or milled PB recess may be entirely arbitrary. A plated or unplated recess can be used to connect the component footprint to one or more PB conductor layers. The component may be positioned over the recess to form an aperture for injecting or otherwise introducing an interfacial material in the interfacial gap between the recess and component surface. In some examples, the interface material may provided for one or more of mechanical bonding, electrical and/or thermal conduction management, and electromagnetic interference/compatibility (EMI/EMC) management. The PBA may include an electrical component, such as a packaged integrated circuit (IC), or a non-electrical component, such as a wedge clamp, heat sink or an EMI/EMC cover. In some examples, unlike a blind, buried, or through via, which may have a predefined connection extent between conductor layers, a recess described herein can have an arbitrary connection extent (depth) to one or more conductor layer without affecting lower conductor layers. Such a feature may be illustrated in cross section FIGS. 2, 3, 6, 8, 9 and 11.

The invention claimed is:
1. An assembly comprising:
a printed board (PB) including a conductive layer, wherein the PB defines a first surface and a recess in the first surface, wherein a surface defining the recess is at least one of electrically or thermally connected to the conductive layer; and
an electrical component body mounted on the PB such that a surface of the electrical component body extends over at least a portion of the recess, wherein the recess extends beyond the electrical component body such that the recess defines an aperture in the first surface for introducing an interface material between the surface of the electrical component body and the surface defining the recess.

2. The assembly of claim 1, wherein at least a portion of the surface defining the recess is copper plated.

3. The assembly of claim 1, wherein the recess defines a substantially rectangular cross-section along a plane substantially orthogonal to a plane defined by the first surface.

4. The assembly of claim 1, further comprising an interface material in the recess, wherein the interface material comprises a thermal interface material that defines a thermal pathway between the surface of the electrical component body and the surface defining the recess.

5. The assembly of claim 1, wherein the recess extends beyond the electrical component body such that the recess defines the aperture for introducing the interface material between the surface of the electrical component body and at least a portion of the first surface of the PB.

6. The assembly of claim 1, further comprising a component package that includes a plurality of leads extending from the electrical component body to electrically connect the electrical component body to the PB via the plurality of leads.

7. The assembly of claim 1, wherein the conductive layer comprises at least one thermally conductive layer.

8. The assembly of claim 7, wherein the PB further comprises:
a plurality of dielectric layers; and
a plurality of electrically conductive layers, wherein the thermally conductive layer is interposed between at least two dielectric layers of the plurality of dielectric layers, and wherein the thermally conductive layer is electrically isolated from the plurality of electrically conductive layers.

9. The assembly of claim 1, wherein the recess comprises a first recess, the electrical component body comprises a first electrical component body, the PB defines a second surface opposite the first surface, the assembly further comprising:
a second recess defined in the second surface of the PB, wherein a surface of the second recess is at least one of electrically or thermally connected to the conductive layer; and
a second electrical body mounted on the PB such that a surface of the second electrical component body extends across at least a portion of the second recess, wherein the second recess extends beyond the second electrical component body such that the second recess defines an aperture in the second surface for introducing the interface material between the surface of the second electrical component body and the surface of the second recess.

10. The assembly of claim 9, wherein the conductive layer comprises a first conductive layer positioned closer to the first surface of the PB than the second surface of the PB, and a second conductive layer positioned closer to the second surface of the PB than the first surface of the PB, wherein the surface of the first recess is thermally connected to the first conductive layer, and the surface of the second recess is thermally connected to the second conductive layer.

11. The assembly of claim 1, wherein the conductive layer defines at least a portion of the surface defining the recess.

12. The assembly of claim 1, wherein a periphery of the recess in the first surface of the PB is bounded by the first surface, and the surface defining the recess is bounded on all sides by the PB.

13. A method comprising:
   placing an electrical component body over a surface of a printed board (PB) that includes a conductive layer, wherein the PB defines a first surface and a recess in the first surface, wherein a surface defining the recess is at least one of electrically or thermally connected to the conductive layer; and
   mounting the electrical component body on the PB such that a surface of the electrical component body extends over at least a portion of the recess, wherein the recess extends beyond the electrical component body such that the recess defines an aperture in the first surface for introducing an interface material between the surface of the electrical component body and the surface defining the recess.

14. The method of claim 13, wherein at least a portion of the surface defining the recess comprises a copper plating.

15. The method of claim 13, wherein the recess defines a substantially rectangular cross-section along a plane substantially orthogonal to a plane defined by the first surface of the PB.

16. The method of claim 13, wherein mounting the electrical component body on the PB comprises electrically connecting the electrical component body to the PB via a plurality of leads.

17. The method of claim 13, wherein the conductive layer comprises a thermally conductive layer, and wherein the PB further comprises:
   a plurality of dielectric layers; and
   a plurality of electrically conductive layers, wherein the thermally conductive layer is interposed between at least two dielectric layers of the plurality of dielectric layers, and wherein the thermally conductive layer is electrically isolated from the plurality of electrically conductive layers.

18. The method of claim 13, wherein the recess comprises a first recess, the electrical component body comprises a first electrical component body, the aperture comprises a first aperture, and the PB defines a second surface opposite the first surface and a second recess in the second surface of the PB, wherein a surface of the second recess is at least one of electrically or thermally connected to the conductive layer, the method further comprising mounting a second component body on the second surface of the PB such that a surface of the second electrical component body extends over at least a portion of the second recess, wherein the second recess extends beyond the second electrical component body such that the second recess defines a second aperture in the second surface for introducing the interface material between the surface of the second electrical component body and the surface of the second recess.

19. The method of claim 13, further comprising introducing an interface material into the recess via the aperture, wherein the interface material comprises a thermal interface material that defines a thermal pathway between the interfacial surfaces between the electrical component body and the PB surface and its recess.

20. The method of claim 13, wherein the recess extends beyond the electrical component body such that the recess defines the aperture for introducing the interface material between the surface of the electrical component body and at least a portion of the first surface of the PB.

21. The method of claim 13, wherein the conductive layer defines at least a portion of the surface defining the recess.

22. The method of claim 13, wherein a periphery of the recess in the first surface of the PB is bounded by the first surface, and the surface defining the recess is bounded on all sides by the PB.

23. An assembly comprising:
   a printed board (PB) including a thermally conductive layer, wherein the PB defines a first surface and a recess in the first surface, and wherein a surface defining the recess is thermally connected to the thermally conductive layer;
   an electrical component body mounted on the PB such that a surface of the electrical component body bridges across the recess; and
   a thermal interface material in the recess, the thermal interface material defining a thermal pathway between the surface of the electrical component body and the surface defining the recess,
   wherein the recess extends beyond the electrical component body such that the recess defines an aperture in the first surface for introducing the thermal interface material between the surface of the electrical component body and the surface defining the recess.

* * * * *